United States Patent
George et al.

(10) Patent No.: US 10,283,354 B2
(45) Date of Patent: May 7, 2019

(54) METHODS OF GROWING THIN FILMS AT LOW TEMPERATURES USING ELECTRON STIMULATED DESORPTION (ESD)

(71) Applicant: THE REGENTS OF THE UNIVERSITY OF COLORADO, A BODY CORPORATE, Denver, CO (US)

(72) Inventors: Steven M. George, Boulder, CO (US); Andrew S. Cavanagh, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/024,269

(22) PCT Filed: Sep. 22, 2014

(86) PCT No.: PCT/US2014/056779
§ 371 (c)(1),
(2) Date: Mar. 23, 2016

(87) PCT Pub. No.: WO2015/042527
PCT Pub. Date: Mar. 26, 2015

(65) Prior Publication Data
US 2016/0218004 A1    Jul. 28, 2016

Related U.S. Application Data

(60) Provisional application No. 61/881,156, filed on Sep. 23, 2013.

(51) Int. Cl.
*H01L 21/02* (2006.01)
*C23C 16/30* (2006.01)
(Continued)

(52) U.S. Cl.
CPC ...... *H01L 21/02381* (2013.01); *C23C 16/303* (2013.01); *C23C 16/345* (2013.01);
(Continued)

(58) Field of Classification Search
CPC ......... H01L 21/02381; H01L 21/02532; H01L 21/0254; H01L 21/02164; H01L 21/0217;
(Continued)

(56) References Cited

U.S. PATENT DOCUMENTS 4,551,908 A    11/1985   Nagasawa et al.
4,605,566 A     8/1986   Matsui et al.
(Continued)

OTHER PUBLICATIONS

Bozso, F. et al. in "Reaction of Si(100) with NH3: Rate-limiting Steps and Reactivity Enhancement via Electronic Excitation," Sep. 1, 1986, Physical Review Letters, vol. 57, No. 9, pp. 1185-1188.*
(Continued)

*Primary Examiner* — Michael Jung
(74) *Attorney, Agent, or Firm* — Saul Ewing Arnstein & Lehr LLP; Kathryn Doyle; Domingos J. Silva

(57) ABSTRACT

The invention includes a method of promoting thin film growth on a solid substrate, wherein derivatization of the substrate comprises formation of at least one surface species. In certain embodiments, the method comprises desorbing the surface species from the substrate using electron stimulated desorption (ESD).

16 Claims, 20 Drawing Sheets

(51) Int. Cl.
        *C23C 16/34*     (2006.01)
        *C23C 16/40*     (2006.01)
        *C23C 16/455*    (2006.01)

(52) U.S. Cl.
        CPC ........ *C23C 16/402* (2013.01); *C23C 16/4554* (2013.01); *H01L 21/0217* (2013.01); *H01L 21/0228* (2013.01); *H01L 21/0254* (2013.01); *H01L 21/0259* (2013.01); *H01L 21/0262* (2013.01); *H01L 21/02164* (2013.01); *H01L 21/02266* (2013.01); *H01L 21/02532* (2013.01); *H01L 21/02631* (2013.01)

(58) Field of Classification Search
        CPC ........... H01L 21/0259; H01L 21/02631; H01L 21/02266; H01L 21/0228
        See application file for complete search history.

(56) References Cited

U.S. PATENT DOCUMENTS

| | | | | |
|---|---|---|---|---|
| 5,015,323 | A * | 5/1991 | Gallagher | B82B 3/00 118/723 VE |
| 5,352,330 | A * | 10/1994 | Wallace | B82Y 30/00 117/108 |
| 6,576,053 | B1 * | 6/2003 | Kim | C30B 25/02 117/102 |
| 2008/0141937 | A1 | 6/2008 | Clark et al. | |

OTHER PUBLICATIONS

Adams, et al., "Nanometer-Scale Lithography on Si(001) Using Adsorbed H as an Atomic Layer Resist", J. Vac. Sci. & Technol. B, vol. 14, No. 3, 1996, pp. 1642-1649.
Albert, et al., "Absolute Total Cross Sections for Electron-Stimulated Desorption of Hydrogen and Deuterium from Silicon(111) Measured by Second Harmonic Generation", Physical Review B, vol. 63, 2000, pp. 035308-1-035308-5.
Avouris, et al., "Breaking Individual Chemical Bonds via STM-induced Excitations", Surf. Sci, vol. 363, 1996, pp. 368-377.
Becker, et al., "Atomic Scale Conversion of Clean Si(111):H-1 x 1 to Si(111)-2 x 1 by Electron-Stimulated Desorption", Phys. Rev. Lett., vol. 65, No. 15, 1990, pp. 1917-1920.
Bellitto, et al., "Desorption of Hydrogen from GaN(0001) Observed by HREELS and ELS", Surf. Sci. Lett., vol. 442, 1999, pp. L1019-L1023.
Bellitto, et al., "Efficient Electron-Stimulated Desorption of Hydrogen from GaN(0001)", Physical Review B: Condens. Matter Mater. Phys., vol. 60, No. 7, 1999, pp. 4821-4825.
Bermudez, et al., "The Dependence of the Structure and Electronic Properties of Wurtzite GaN Surfaces on the Method of Preparation", Appl. Surf. Sci., vol. 126, 1998, pp. 69-82.
Chiang, et al., "Hydrogen Desorption and Ammonia Adsorption on Polycrystalline GaN Surfaces", Chem. Phys. Lett., vol. 246, 1995, pp. 275-278.
Feibelman, et al., "Reinterpretation of Electron-Stimulated Desorption Data from Chemisorption Systems", Physical Review B, vol. 18, No. 12, 1978, pp. 6531-6539.
Fuse, et al., "Electron-Stimulated Desorption of Hydrogen from H/Si(001)-1 x 1 Surface Studied by Time-of-Flight Elastic Recoil Detection Analysis", Surf. Sci, vol. 420, 1999, pp. 81-86.
Hitosugi, et al., "Scanning Tunneling Microscopy/Spectroscopy of Dangling-Bond Wires Fabricated on the Si(100)-2 x 1-H Surface", Appl. Surf. Sci., vol. 130-132, 1998, pp. 340-345.
Huang, et al., "Growth of Wurtzite GaN on (001)GaAs Substrates at Low Temperature by Atomic Layer Epitaxy", J. Mater. Sci. Lett., vol. 17, 1998, pp. 1281-1285.

Karam, et al., "Growth of Device Quality GaN at 550 Degrees C by Atomic Layer Epitaxy", Appl. Phys. Lett., vol. 67, No. 1, 1995, pp. 94-96.
Khan, et al., "Atomic Layer Epitaxy of GaN Over Sapphire Using Switched Metalorganic Chemical Vapor Deposition", Appl. Phys. Lett. vol. 60, No. 11, 1991, pp. 1366-1368.
Kim, et al., "Atomic Layer Deposition of GaN Using GaCl3 and NH3", J. Vac. Sci. Technol. A., vol. 27, No. 4, 2009, pp. 923-928.
Knotek, et al., "Ion Desorption by Core-Hole Auger Decay", Phys. Rev. Lett., vol. 40, No. 14, 1978, pp. 964-967.
Koebley, et al., "Degassing a Vacuum System with in-situ UV Radiation", J. Vac. Sci. & Technol. A, vol. 30, No. 6, 2012, pp. 060601-1-060601-3.
Koukitu, et al., "Halogen-Transport Atomic-Layer Epitaxy of Cubin GaN Monitored by In Situ Gravimetric Method", Jpn. J. Appl. Phys., vol. 38, 1999, pp. 4980-4982.
Kumagai, et al., "In situ Gravimetric Monitoring of Halogen Transport Atomic Layer Epitaxy of Cubic-GaN", Applied Surface Science, vol. 159-160, 2000, pp. 427-431.
Lyding, et al., "Nanoscale Patterning and Oxidation of H-passivated Si(100)-2 x 1 Surfaces with an Ultrahigh Vacuum Scanning Tunneling Microscope", Appl. Phys. Lett., vol. 64, No. 15, 1994, pp. 2010-2012.
Madey, et al., "Electron-Stimulated Desorption as a Tool for Studies of Chemisorption: A Review", The Journal of Vacuum Science and Technology, vol. 8, No. 4, 1971, pp. 525-555.
Menzel, et al., "Desorption from Metal Surfaces by Low-Energy Electrons", J. Chem. Phys., vol. 41, No. 11, 1964, pp. 3311-3328.
Ozgit, et al., "Atomic Layer Deposition of GaN at Low Temperatures", J. Vac. Sci. Technol. A, vol. 30, No. 1, 2012, pp. 01A124-1-01A124-4.
Ozgit-Akgun, et al., "Hollow Cathode Plasma-Assisted Atomic Layer Deposition of Crystalline AlN, GaN and AlxGa1-xN Thin Films at Low Temperatures", J. Mater. Chem. C, vol. 2, 2014, pp. 2123-2136.
Ramsier, et al., "Electron-Stimulated Desorption: Principles and Applications", Surf. Sci. Rep., No. 12, 1991, pp. 243-378.
Randall, et al., "Atomic Precision Lithography on Si", J. Vac. Sci. Technol. B, vol. 27, No. 6, 2009, pp. 2764-2768.
Redhead, "Interaction of Slow Electrons with Chemisorbed Oxygen", Can. J. Phys., vol. 42, 1964, pp. 886-905.
Shekhar, et al., "Temperature Programmed Desorption Investigations of Hydrogen and Ammonia Reactions on GaN", Surf. Sci, vol. 381, 1997, pp. L581-L588.
Shen, et al., "Al Nucleation on Monohydride and Bare Si(001) Surfaces: Atomic Scale Patterning", Phys. Rev. Lett., vol. 78, No. 7, 1997, pp. 1271-1274.
Shen, et al., "Atomic-Scale Desorption Through Electronic and Vibrational Excitation Mechanisms", Science, vol. 268, 1995, pp. 1590-1592.
Shen, et al., "Nanoscale Oxide Patterns on Si(100) Surfaces", Appl. Phys. Lett., vol. 66, No. 8, 1995, pp. 976-978.
Shepperd, "Low-Energy Electron Induced Processes in Hydrocarbon Films Adsorbed on Silicon Surfaces", Thesis, Georgia Institute of Technology, 2009, pp. 1-87.
Sumakeris, "Layer-by-Layer Epitaxial Growth of GaN at Low Temperatures", Thin Solid Films, vol. 225, 1993, pp. 244-249.
Tsuchiya, et al., "Layer-by-Layer Growth of GaN on GaAs Substrates by Alternate Supply of GaCl3 and NH3", Jpn. J. Appl. Phys., vol. 35, 1996, pp. L748-L750.
Von Keudell, et al., "Elementary Processes in Plasma-Surface Interaction: H-Atom and Ion-induced Chemisorption of Methyl on Hydrocarbon Film Surfaces", Progress in Surface Science, 76(1-2), 2004, pp. 21-54.
Goh, et al., "Using Patterned H-resist for Controlled Three-dimensional Growth of Nanostructures", Appl. Phys. Lett., vol. 98, 2011, pp. 163102-1-163102-3.

* cited by examiner

Ga 2p$_{3/2}$ XPS Signal vs Sputter Time

Ga 2p$_{3/2}$ XPS Signal after Sputter Time of 30 s

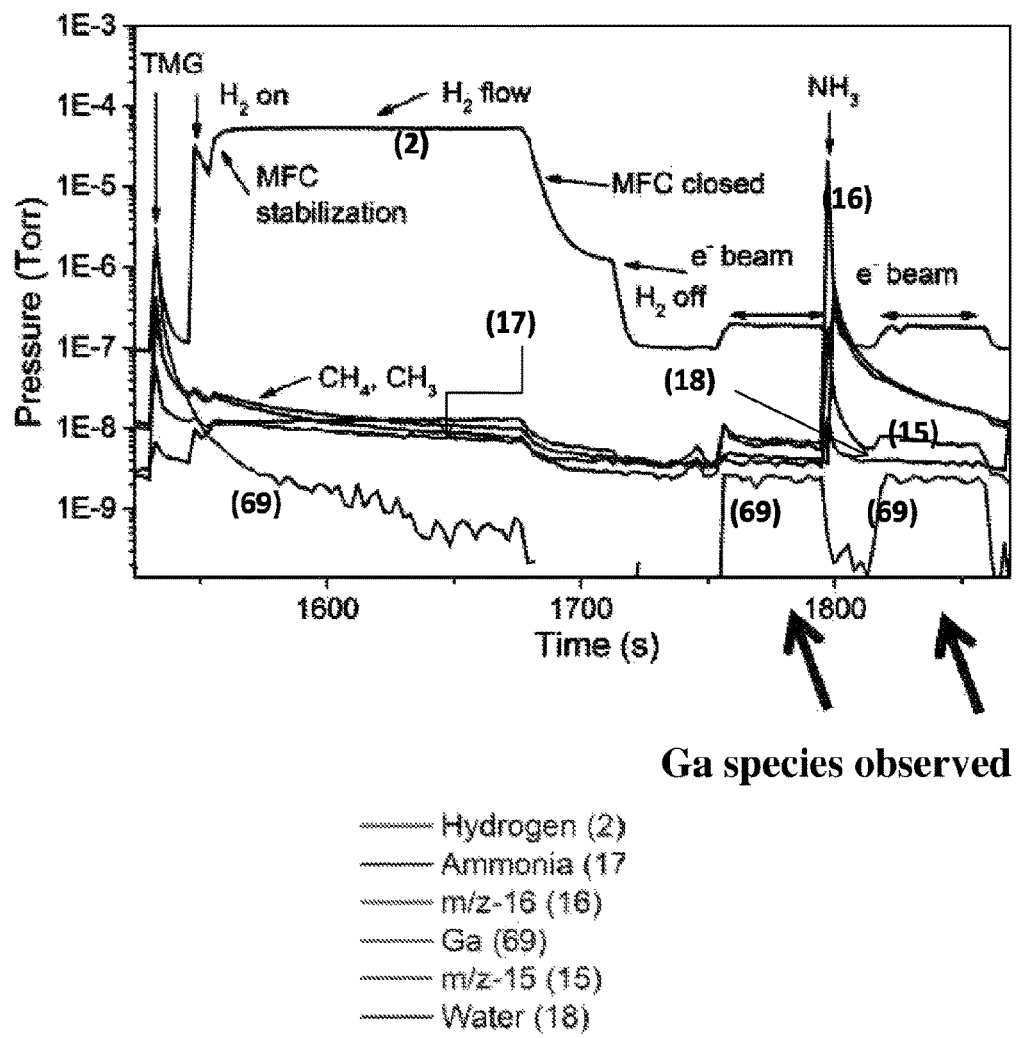

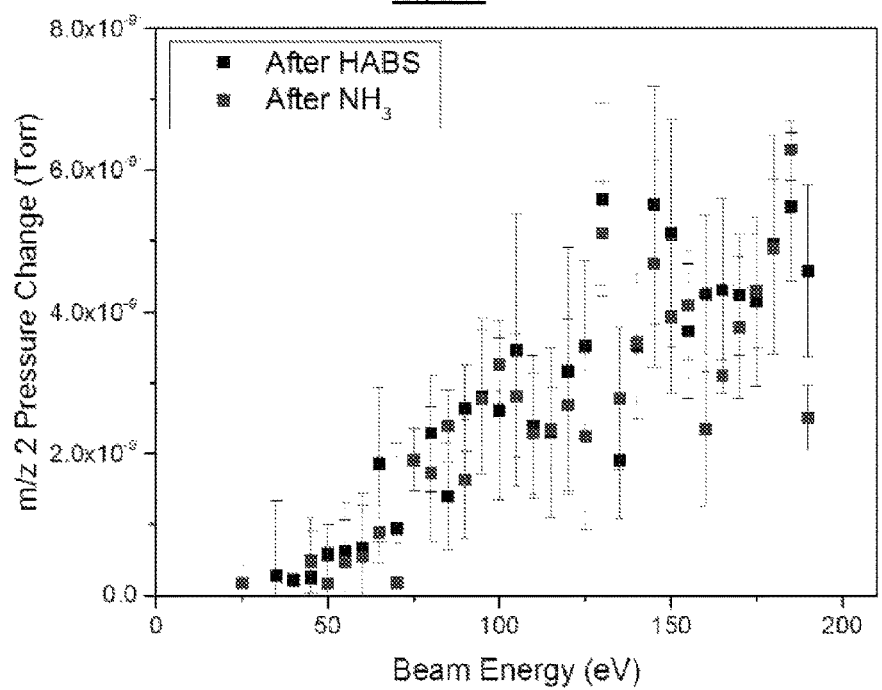
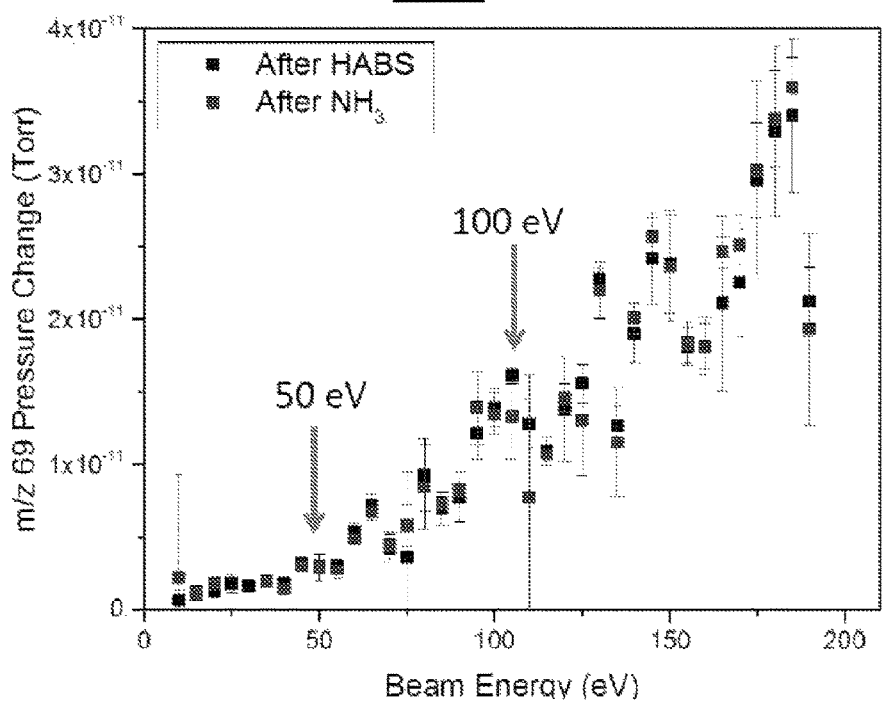

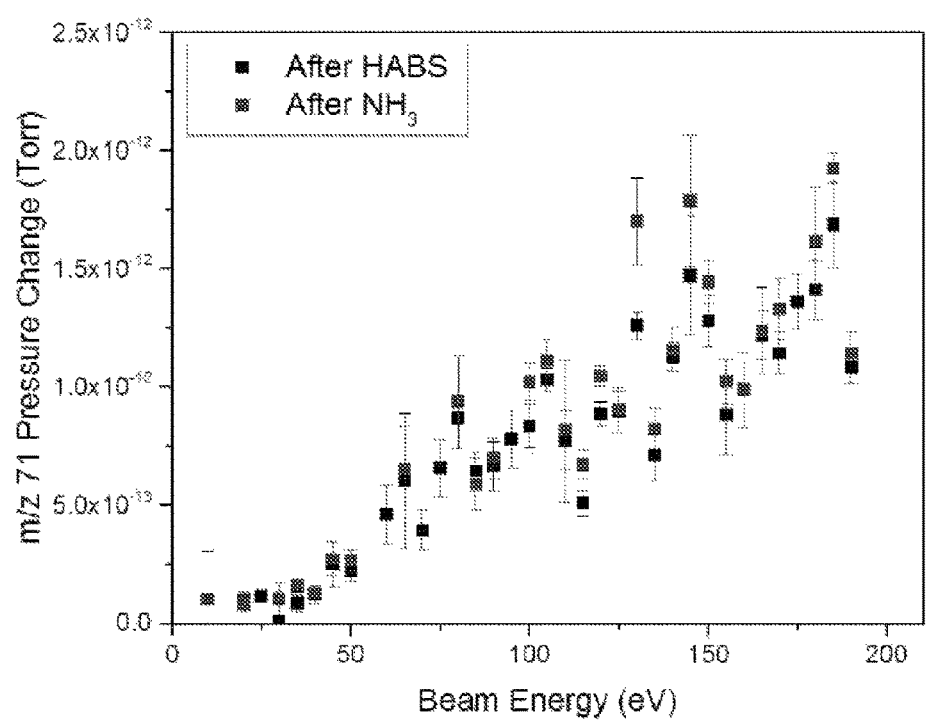

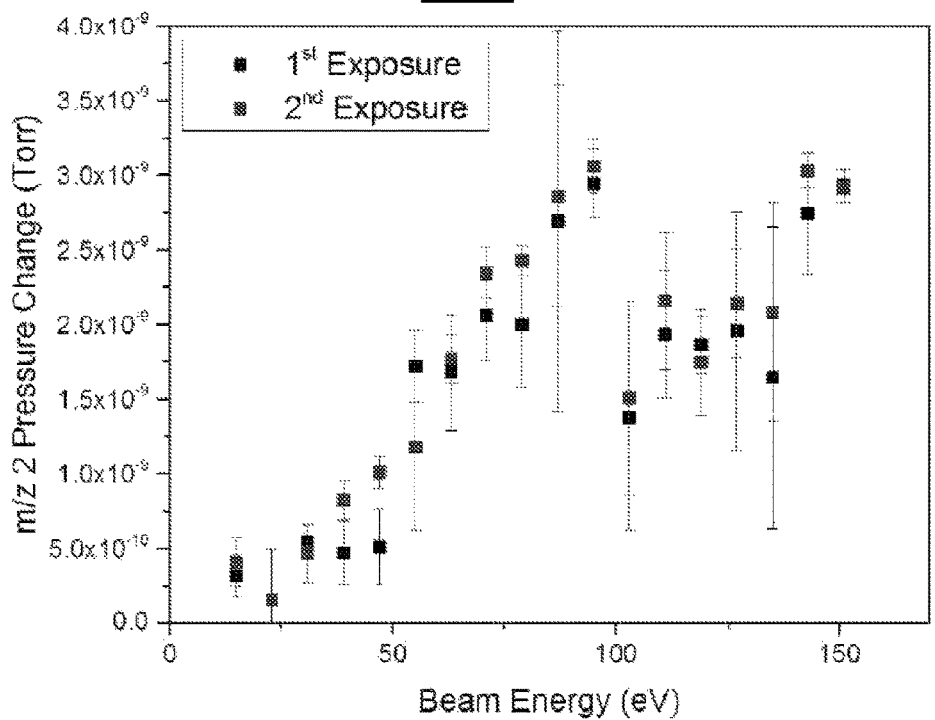
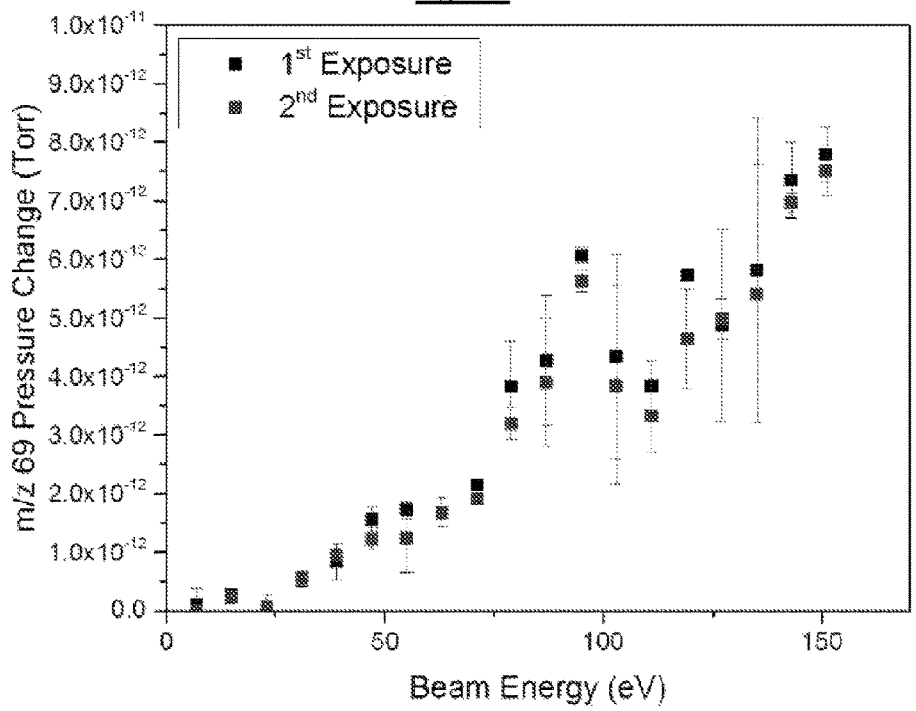

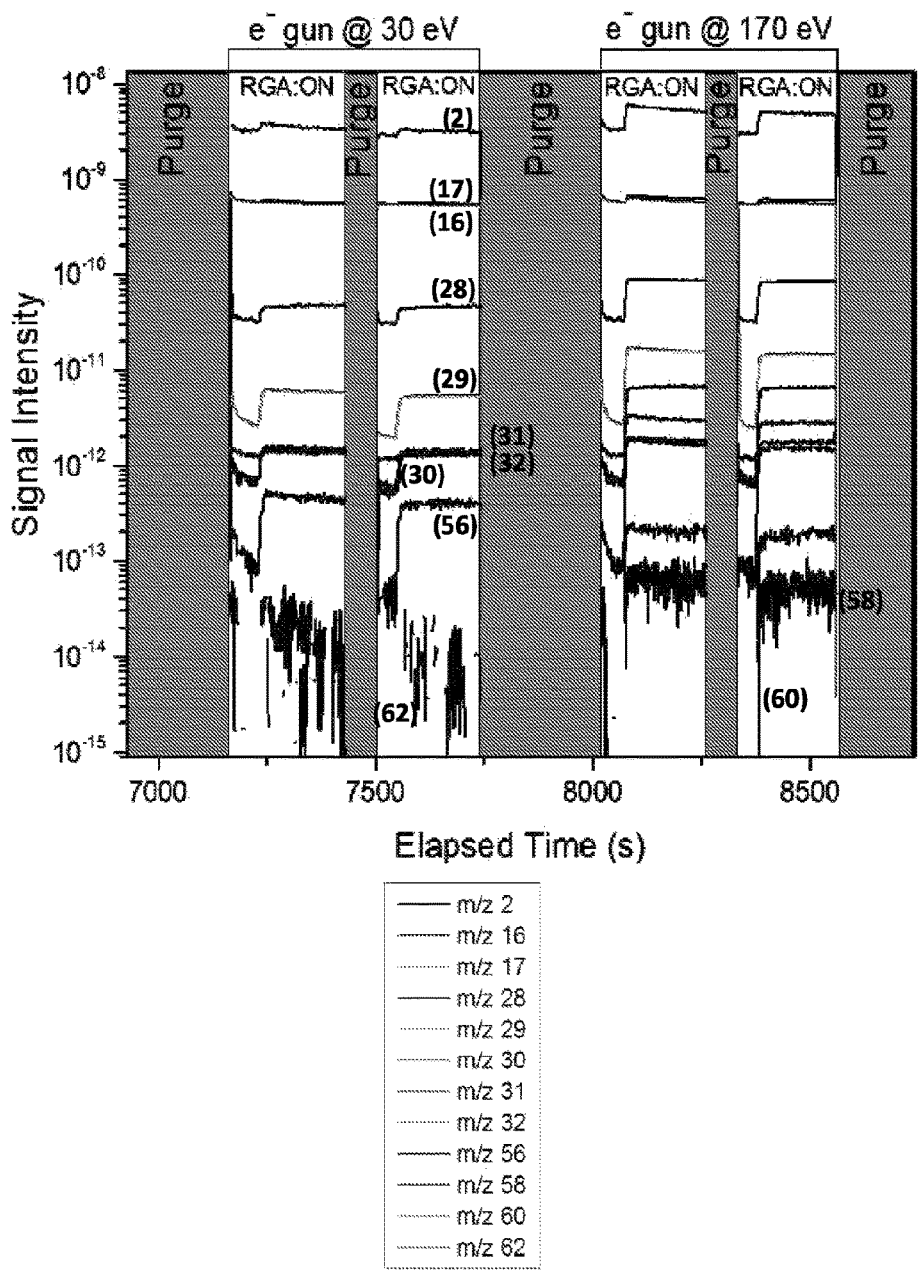

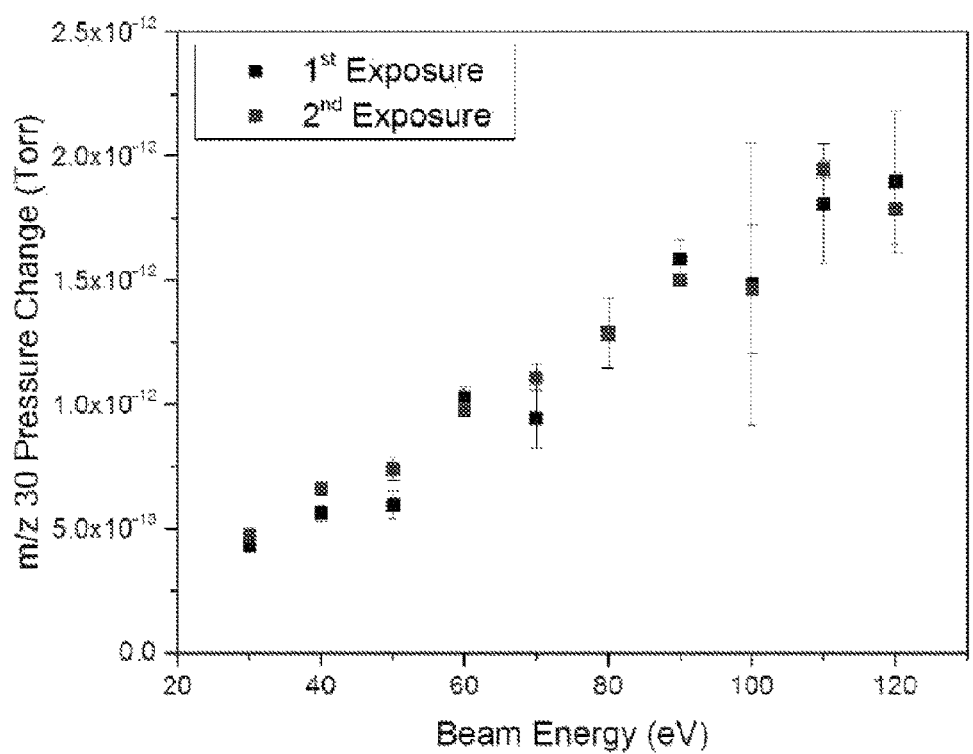

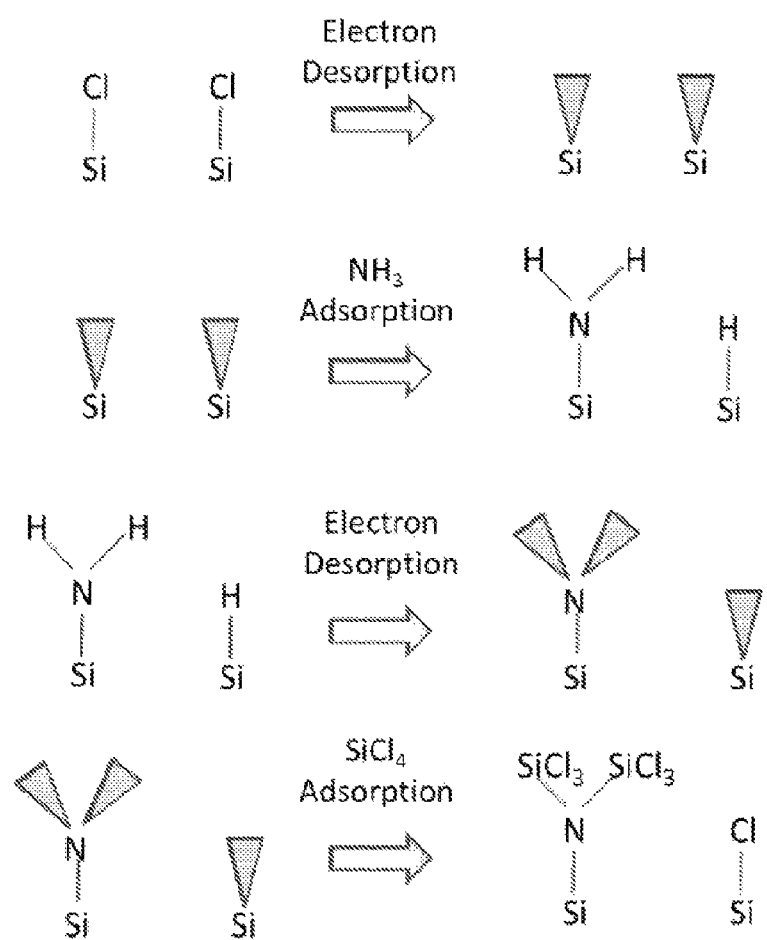

METHODS OF GROWING THIN FILMS AT LOW TEMPERATURES USING ELECTRON STIMULATED DESORPTION (ESD)

CROSS-REFERENCE TO RELATED APPLICATIONS

The present application is a 35 U.S.C. § 371 national phase application of International Application No. PCT/US2014/056779, filed Sep. 22, 2014, and published under PCT Article 21(2) in English, which claims priority to U.S. Provisional Patent Application No. 61/881,156, filed Sep. 23, 2013, the contents of all of which are hereby incorporated herein by reference in their entireties.

STATEMENT REGARDING FEDERALLY SPONSORED RESEARCH OR DEVELOPMENT

This invention was made with government support under grant number W911NF-13-0041 awarded by the U.S. Army Research Office. The government has certain rights in the invention.

BACKGROUND OF THE INVENTION

A thin film corresponds to a layer of material deposited on a solid support or substrate, wherein the layer ranges in thickness from fractions of a nanometer (monolayer) to several micrometers. Thin films are employed, for example, in electronics (e.g., insulators, semiconductors, or conductors for integrated circuits), optical coatings (e.g., reflective, anti-reflective coatings, or self-cleaning glass) and packaging (e.g., aluminum-coated PET film).

Thin film deposition may be accomplished using a variety of gas phase chemical and/or physical vapor deposition techniques. Many of these deposition techniques are able to control layer thickness within a few tens of nanometers. Thin film deposition is also achieved by liquid phase and electrochemical techniques where the thickness of the final film is not well controlled. Examples include copper deposition by electroplating and sol gel deposition.

Gas phase deposition techniques fall into two broad categories, depending on whether the process is primarily chemical or physical. In a chemical deposition process, a precursor undergoes a chemical change at a solid surface, leaving a solid layer on the surface. In a chemical vapor deposition (CVD) process, a gas-phase precursor, often a halide or hydride of the element to be deposited, reacts with a substrate on the surface, leading to formation of the thin film on the surface.

The molecular precursors used in CVD are composed of at least one central element and at least one ligand bound to the central element. Upon reaction of the molecular precursor with the substrate, the central element is incorporated in the thin film. The ligand usually leaves the system as a gas phase reaction product.

One example of a unimolecular CVD reaction is the reaction of silane ($SiH_4$) to form silicon thin films. The reaction is $SiH_4 \rightarrow Si + 2H_2$. A silicon atom is the central element in the $SiH_4$ molecule, and hydrogen atoms are ligands bound to the central element. $H_2$ is the gas phase reaction product.

One example of a bimolecular CVD reaction is the growth of TiN using $TiCl_4$ and $NH_3$. This reaction is $6\ TiCl_4 + 8\ NH_3 \rightarrow 6 TiN + N_2 + 24\ HCl$. In this bimolecular reaction, Ti is the central element in the $TiCl_4$ molecule, and Cl atoms are ligands bound to the central element Ti. N is the central element in the $NH_3$ molecule, and H atoms are ligands bound to the central element N. HCl is the gas phase reaction product.

CVD reactions are usually run at temperatures that allow for desorption of the reaction products from the surface of the growing film. In the case of silicon deposition using $SiH_4$, the thin film growth is kinetically limited by $H_2$ desorption from the silicon surface at the lowest possible temperatures for silicon thin film growth. In the case of TiN deposition using $TiCl_4$ and $NH_3$, TiN growth is limited by HCl desorption at the lowest possible temperatures for TiN thin film growth.

Such desorption temperature may be rather high in practice. For example, for silicon growth using $SiH_4$, the $H_2$ desorption temperature occurs at about 500° C., and thus silicon growth requires temperatures higher than 500° C. (generally 900-1100° C.). Similarly, the minimum temperature for TiN growth using $TiCl_4$ and $NH_3$ is greater than about 500° C., presumably because effective HCl desorption requires such temperatures. At temperatures lower than the desorption temperature for the HCl reaction product, the H and Cl ligands remain bound to the TiN surface, thus blocking sites needed for additional thin film growth. The CVD growth temperatures for diamond are generally 800-1100° C., for SiC are generally 1400-1550° C., and for GaN are generally 800-1100° C.

Electron stimulated desorption (ESD) is a technique used to remove species from surfaces at low temperature. ESD has been used in a method known as electron stimulated desorption in ion angular distributions (ESDIAD) to perform surface analysis.

There is a need in the art for novel methods of promoting thin film growth at low temperatures. In one aspect, such methods should allow for the atom-level control of the film growth, while using lower and more manageable experimental temperatures. In another aspect, such methods should allow for film growth on a macroscopic scale. The present invention meets this need.

BRIEF SUMMARY OF THE INVENTION

The invention includes methods of promoting thin film growth on a solid substrate. The invention further include thin films prepared according to methods of the invention.

In certain embodiments, the method comprises (a) submitting the solid substrate to electron stimulated desorption (ESD) to desorb a surface species, thus generating at least one active site on the substrate.

In certain embodiments, the method further comprises (b) reacting a first molecule, wherein the first molecule comprises a first central element and a first ligand, with the substrate generated in step (a), whereby the first molecule is physically or chemically adsorbed onto the substrate.

In certain embodiments, the temperature required for desorbing the surface species from the substrate using ESD is lower than the temperature required for thermally desorbing the surface species from the substrate. In other embodiments, the temperature required for desorbing the surface species using ESD is equal to or lower than about 100° C. In yet other embodiments, the temperature required for desorbing the surface species using ESD is about room temperature.

In certain embodiments, the surface species is at least one selected from the group consisting of hydrogen, $CH_3$ (methyl), $CH_2CH_3$ (ethyl), $N(CH_3)_2$ (dimethylamino), Cl, Br, F, CO, cyclopentadienyl (Cp) and substituted cyclopentadienyl, and acetylacetonate (acac) and other beta-diketonates.

In certain embodiments, the electron energy used during ESD is equal to or lower than about 100 eV. In other embodiments, the electron energy used during ESD ranges from about 25 eV to about 50 eV.

In certain embodiments, the method allows for the controlled growth of the thin film.

In certain embodiments, the method further comprises: (c) in the case that the ligand is not a hydride, optionally submitting the substrate generated in step (b) to hydrogen radical flux, whereby the substrate-bound ligand is replaced with substrate-bound hydride ligand; and, (d) optionally repeating steps (a)-(c) until the desired film thickness is obtained.

In certain embodiments, the molecule comprises a hydride ligand. In other embodiments, the hydride comprises $SiH_4$.

In certain embodiments, ESD is applied during the reaction in step (b). In other embodiments, ESD is applied to the substrate during at least one step selected from step (b) and step (e). In yet other embodiments, the method allows for continuous thin film growth.

In certain embodiments, the method further comprises: (c) in the case that the first ligand is not hydride, optionally submitting the substrate generated in step (b) to hydrogen radical flux, whereby the substrate-bound first ligand is replaced with substrate-bound hydride ligand; (d) submitting the solid substrate generated in step (b) or (c) to ESD, thus generating at least one active site on the substrate; (e) reacting a second molecule, wherein the second molecule comprises a second central element and a second ligand, with the substrate generated in step (d), whereby the second molecule is physically or chemically adsorbed onto the substrate; (f) in the case that the second ligand is not a hydride, optionally submitting the substrate from step (e) to hydrogen radical flux, whereby the substrate-bound second ligand is replaced with substrate-bound hydride ligand; and, (g) optionally repeating steps (a)-(f) until the desired film thickness is obtained.

In certain embodiments, the first and second molecules comprise a hydride ligand. In other embodiments, the first molecule comprises $GaH_3$ and the second molecule comprises $NH_3$. In yet other embodiments, the first molecule comprises a methyl or chloride ligand. In yet other embodiments, the first molecule comprises $Ga(CH_3)_3$ or $GaCl_3$. In yet other embodiments, the first molecule comprises a hydride ligand and the second molecule comprises a chloride ligand. In yet other embodiments, the first molecule comprises $NH_3$ or $H_2O$, and wherein the second molecule comprises $SiCl_4$. In yet other embodiments, the first molecule comprises a methyl ligand and the second molecule comprises a hydrogen ligand. In yet other embodiments, the first molecule comprises $Ga(CH_3)_3$ and the second molecule comprises $NH_3$.

In certain embodiments, the solid substrate comprises Si-CMOS and the thin film comprises GaN. In other embodiments, the solid substrate comprises a molybdenum/silicon multilayer substrate and the thin film comprises silicon. In yet other embodiments, the thin film comprises at least one selected from the group consisting of $Si_3N_4$ and $SiO_2$.

In certain embodiments, the thin film is at least partially crystalline. In other embodiments, the thin film is at least partially epitaxial to the solid substrate. In certain embodiments, the solid substrate comprises a diamond substrate, the method further comprising: (b) submitting the substrate generated in step (a) to methyl radical flux; (c) reacting the substrate generated in step (b) with hydrogen ions; (d) reacting the substrate generated in step (c) with a hydrogen radical flux; and, (e) optionally repeating steps (a)-(d) until the desired film thickness is obtained.

BRIEF DESCRIPTION OF THE FIGURES

For the purpose of illustrating the invention, there are depicted in the drawings certain embodiments of the invention. However, the invention is not limited to the precise arrangements and instrumentalities of the embodiments depicted in the drawings.

FIG. 7, comprising FIG. 7A illustrates intensity of the Ga $2p_{3/2}$ XPS signal as a function of sputter time. FIG. 7B illustrates the Ga $2p_{3/2}$ XPS signal after a sputter time of 30 seconds; the contributions of Ga $2p_{3/2}$ ($Ga_2O_3$) and Ga $2p_{3/2}$ (GaN) to the signal are noted. Spectral assignments were derived from Wolter et al., 1997, Appl. Phys. Lett. 70:2156.

FIG. 10, comprising

FIG. 11, comprising FIGS. 11A-11C, is a set of graphs illustrating in situ QMS measurements taken during the GaN film growth in Example 1, Experiments I-III. The measurements in FIG. 11A were obtained using an electron energy of 100 eV. The measurements in FIG. 11B were obtained using an electron energy of 100 eV with longer hydrogen radical exposures. The measurements in FIG. 11C were obtained using an electron energy of 50 eV.

FIG. 13, comprising FIGS. 13A-13C, is a set of graphs illustrating pressure jumps at m/z=2 ($H_2^+$; FIG. 13A), m/z=69 ($Ga^+$; FIG. 13B) and m/z=71 ($GaH_2^+$; FIG. 13C) observed for electron beam exposure at various electron beam energies during GaN growth.

FIG. 14, comprising FIGS. 14A-14D, illustrates mass spectrometry pressures observed during hydrogen and electron beam exposures at various electron beam energies on a GaN film under conditions in which there was no film growth. FIG. 14A is a graph illustrating time-dependent sample currents and pressure for various species. FIGS. 14B-14C are a set of graphs illustrating observed pressure jumps at m/z=2 ($H_2^+$; FIG. 14B), and m/z=69 ($Ga^+$; FIG. 14C). The discontinuity at about 100 eV was attributed to lower current from electron optics effect.

FIG. 15, comprising FIGS. 15A-15D, illustrates mass spectrometry pressures observed during hydrogen and electron beam exposures on a clean Si(111) wafer. FIG. 15A is a graph illustrating time-dependent sample currents and pressure for various species. FIGS. 15B-15D are a set of graphs illustrating pressure jumps at m/z=2 ($H_2^+$; FIG. 15B), m/z=31 ($SiH_3^+$; FIG. 15C) and m/z=30 ($SiH_2^+$; FIG. 15D) observed for electron beam exposure under alternating hydrogen and electron beam exposures at various electron beam energies.

FIG. 16, comprising FIGS. 16A-16C, illustrates the use of methods of the invention to deposit a GaN film on Si-CMOS to generate a multiple pixel LED (FIG. 16A), to deposit silicon layers on Mo/Si multilayers to generate a EUV mirror (FIG. 16B), and to deposit a $Si_3N_4$ layer on a substrate (FIG. 16C). In certain embodiments, a $Si_3N_4$ layer is deposited using $NH_3$. In other embodiments, a $SiO_2$ layer is deposited using $H_2O$.

FIG. 17, comprising

DETAILED DESCRIPTION OF THE INVENTION

Figure 1:
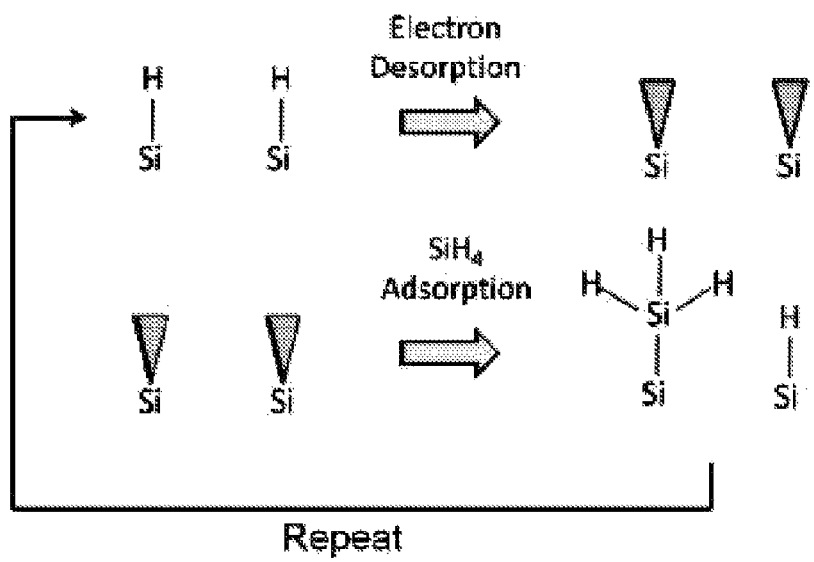
FIG. 1 is a schematic illustration of a non-limiting example of the growth of silicon at low temperatures using ESD and $SiH_4$.

The present invention relates in part to the unexpected discovery that ESD can be used as part of a stepwise surface reaction sequence to grow thin films on a substrate at a lower temperature than the temperature required for the thermal CVD reaction. In certain embodiments, the stepwise sequence of surface reactions allows for the control of the thickness of the growth film. In other embodiments, the methods of the invention allow for atomic level control, similarly to the sequential, self-limiting surface reactions that are used in thin film growth using atomic layer deposition (ALD). In yet other embodiments, the methods of the invention allow for thin film growth on a macroscopic scale, and is not limited to a nanoscale or microscale.

In one aspect, ESD is applied during reactant exposures (e.g., an ESD-enhanced CVD process). In certain embodiments, the thin film growth rate during ESD-enhanced CVD is higher than the rate observed when ESD is not used during reactant exposures.

In one aspect, ESD is employed during exposure with a hydride reactant, in order to achieve a continuous CVD-like thin film growth process. In certain embodiments, the electrons promote desorption of hydrogen gas continuously as the hydride reactants impinge onto the surface. In other embodiments, the electrons desorb hydrogen from the adsorbed reactants to produce a "dangling bond" site. A hydride reactant then immediately adsorbs onto the free "dangling bond" site. Subsequently, hydrogen may be desorbed from the adsorbed reactant to repeat the growth sequence. This CVD-like growth process leads to continuous thin film growth. This CVD-like application of ESD finds application in a variety of CVD processes such as Si CVD using $SiH_4$ and GaN CVD using $GaH_3$ and $NH_3$.

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

As used herein, the term "CVD" refers to chemical vapor deposition.

As used herein, the term "ESD" refers to electron stimulated desorption.

As used herein, the term "ESDIAD" refers to electron stimulated desorption in ion angular distributions.

As used herein, the term "HABS" refers to hydrogen atomic beam source.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of the compositions.

As used herein, the term "QMS" refers to quadrupole mass spectrometry.

As used herein, the term "SE" refers to spectroscopic ellipsometry.

As used herein, the term "Si-CMO" refers to silicon-based complementary metal-oxide semiconductor.

As used herein, the term "TMA" refers to trimethylaluminum.

As used herein, the term "TMG" refers to trimethylgallium.

As used herein, the term "XPS" refers to X-ray photoelectron spectroscopy.

As used herein, the term "XRR" refers to X-ray reflectivity.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

DISCLOSURE

The present invention relates to the unexpected discovery that ESD may be used as part of a stepwise surface reaction sequence to grow thin films on a substrate. In one aspect, the use of ESD in growing thin films allows for lower experimental temperatures as compared to the temperature required for the thermal CVD reaction. In another aspect, the stepwise sequence of surface reactions allows for the control of the thickness of the growth film. In yet another aspect, the thickness of the growing film is approximately linearly dependent on the number of stepwise sequences used to grow the thin film, similarly to the process of thin film growth using atomic layer deposition.

In one aspect, the invention contemplates the growth of silicon using ESD and $SiH_4$ at a lower temperature than the temperature required for $H_2$ thermal desorption. A non-limiting schematic of this stepwise sequence of surface reactions is illustrated in FIG. 1. During the stepwise sequence of surface reactions, hydrogen is desorbed from the surface at low temperatures using ESD to produce active "dangling bond" sites on the surface. $SiH_4$ is then dissociatively adsorbed on these "dangling bond" sites on the surface. After the "dangling bond" sites are filled, no more $SiH_4$ may adsorb on the surface. In the second stepwise sequence of surface reactions, ESD can again be used to desorb hydrogen from the surface and produce new "dangling bond" sites. $SiH_4$ may then again be dissociatively adsorbed on these new "dangling bond" sites. This sequence of stepwise reactions can be repeated multiple times using the ESD/$SiH_4$ procedure to grow the silicon film.

Figure 2:
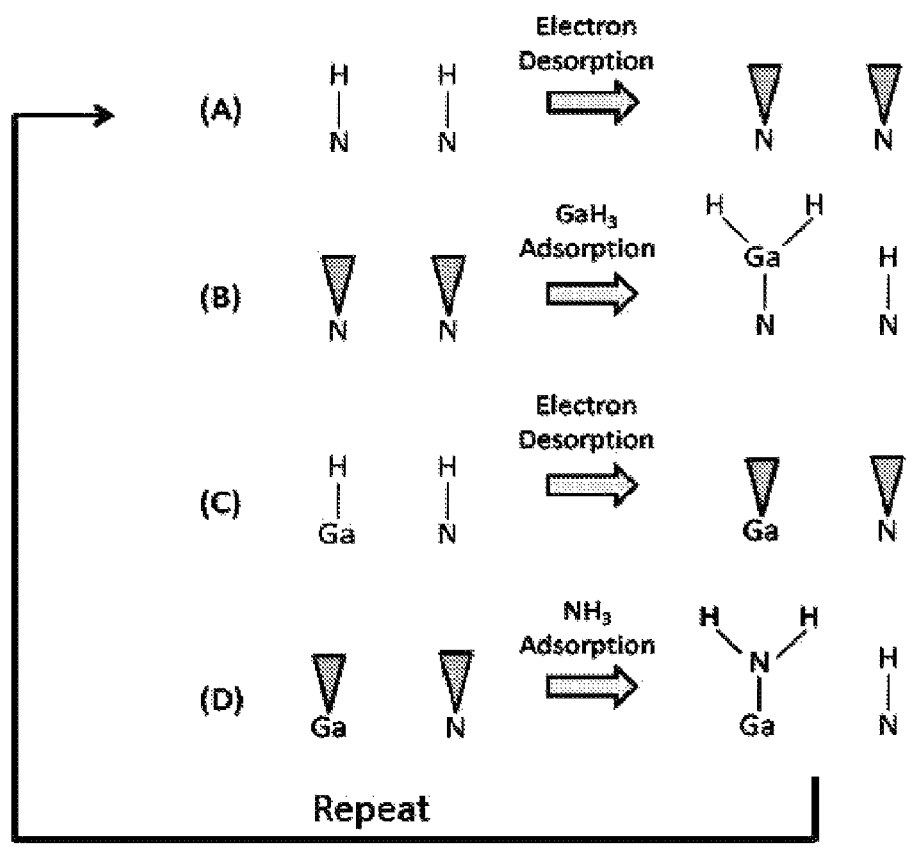
FIG. 2 is a schematic illustration of a non-limiting example of the growth of GaN at low temperatures using ESD, $GaH_3$ and $NH_3$.

In another aspect, the invention contemplates the growth of GaN using ESD, $GaH_3$ and $NH_3$ at a lower temperature than the temperature required for the thermal CVD reaction. A non-limiting schematic of this stepwise sequence of surface reactions is illustrated in FIG. 2. During the stepwise sequence of surface reactions, hydrogen is desorbed from the surface at low temperatures using ESD to produce active "dangling bond" sites on the surface. $GaH_3$ is then dissociatively adsorbed on these "dangling bond" sites on the surface. After the "dangling bond" sites are filled, no more $GaH_3$ may adsorb on the surface. ESD is again used to desorb hydrogen from the surface and produce new "dangling bond" sites. $NH_3$ is then dissociatively adsorbed on these new "dangling bond" sites. This sequence of stepwise reactions can be repeated multiple times using the ESD/$GaH_3$-ESD/$NH_3$ procedure to grow the GaN film.

Figure 3:
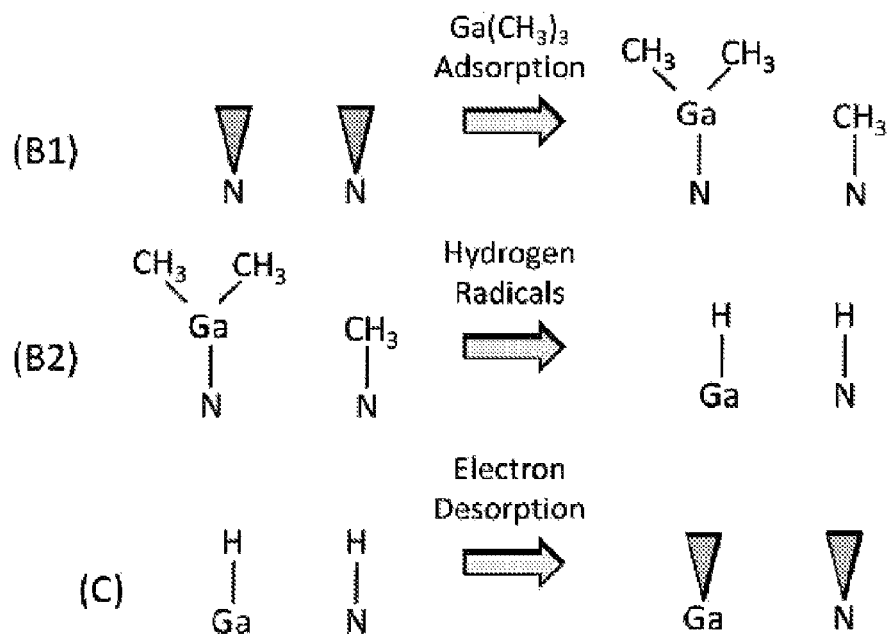
FIG. 3 is a schematic illustration of the conversion of a non-hydride surface species to a hydride surface species using hydrogen radicals. This conversion may be used, for example, for the growth of GaN at low temperatures using ESD, $Ga(CH_3)_3$ and $NH_3$.

In yet another aspect, variations of this stepwise sequence may be employed using Ga reactants that are not hydride precursors. In non-limiting embodiments, $Ga(CH_3)_3$ may be used instead of $GaH_3$. According to these embodiments, hydrogen radical flux onto the surface is needed to remove the $CH_3$ species and replace the $CH_3$ species with H species. This conversion of $CH_3$ species with H species is illustrated in FIG. 3. Hydrogen radical fluxes can be prepared, in a non-limiting example, by thermally cracking molecular $H_2$ using a heated surface. Alternatively, in certain embodiments, $GaCl_3$ is used in place of $GaH_3$. According to these embodiments, a hydrogen radical flux onto the surface is used to remove the Cl species and replace the Cl species with H species.

Figure 4:
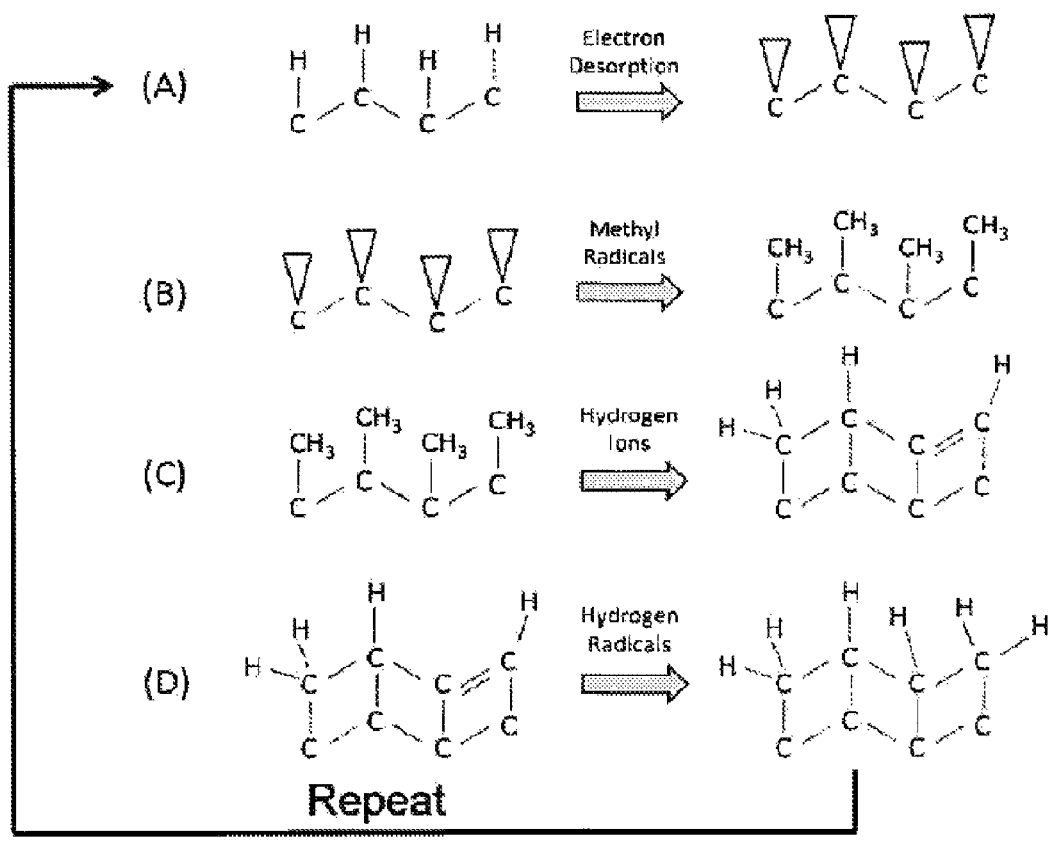
FIG. 4 is a schematic illustration of a non-limiting example of growth of diamond at low temperatures using ESD, $CH_3$ radicals, $H^+$ ions and H radicals.

In yet another aspect, the invention contemplates the growth of diamond using the sequential application of ESD, $CH_3$ radicals, $H^+$ ions and H radicals at a lower temperature than the temperature required when using thermal desorption. A non-limiting schematic of this stepwise sequence of surface reactions is illustrated in FIG. 4. During the stepwise sequence of surface reactions, hydrogen is desorbed from the surface at low temperatures using ESD to produce active "dangling bond" sites on the surface. $CH_3$ radicals are then dissociatively adsorbed on these "dangling bond" sites on the surface. After the "dangling bone" sites are filled, no more $CH_3$ radicals may adsorb on the surface. $H^+$ ions can then be used to incorporate the $CH_3$ species into the diamond surface. A hydrogen radical flux may then help remove any $sp^2$ carbon and leave behind $sp^3$ carbon. This process may then be repeated and ESD may again be used to desorb hydrogen from the surface and produce new "dangling bond" sites. This sequence of stepwise reactions may be repeated using the ESD/$CH_3$/$H^+$ ion/H radical procedure to grow the diamond film.

In yet another aspect, the invention contemplates the growth of $Si_3N_4$ using the sequential application of ESD, $NH_3$ adsorption, electron desorption and $SiCl_4$ adsorption at a lower temperature than the temperature required when using the thermal CVD reaction. A non-limiting schematic of this stepwise sequence of surface reactions is illustrated in FIG. 16C. During the stepwise sequence of surface reactions, Cl is desorbed from the surface at low temperatures using ESD to produce active "dangling bond" sites on the surface. $NH_3$ is then dissociatively adsorbed on these "dangling bond" sites on the surface. After the "dangling bond" sites are filled, no more $NH_3$ may adsorb on the surface. Electron desorption of hydrogen then leads to forming of "dangling bond" sites that may adsorb $SiCl_4$.

This process may then be repeated and ESD may again be used to desorb chloro from the surface and produce new "dangling bond" sites. This sequence of stepwise reactions may be repeated to grow the $Si_3N_4$ film.

In yet another aspect, the electron energy and/or the temperature used in the methods of the invention may affect any concurrent etching process that may take place on the surface. In certain embodiments, hydrogen ESD processes are performed at low electron energies and/or low temperatures, in order to minimize etchings and maximize hydrogen ESD.

In certain embodiments, the ESD is performed at a temperature equal to or lower than about 100° C., about 80° C., about 60° C., about 50° C., about 40° C., about 30° C. or about 20° C. In other embodiments, the ESD is performed at about room temperature.

In certain embodiments, the electron energy is set at a value equal to or lower than the core electron binding energy of the components of the film. In yet other embodiments, the electron energy is equal to or lower than about 100 eV, about 75 eV, about 50 eV, about 25 eV, about 20 eV or about 10 eV. In yet other embodiments, the electron energy ranges from about 10 eV to about 20 eV, or from about 10 eV to about 25 eV.

Figure 12:
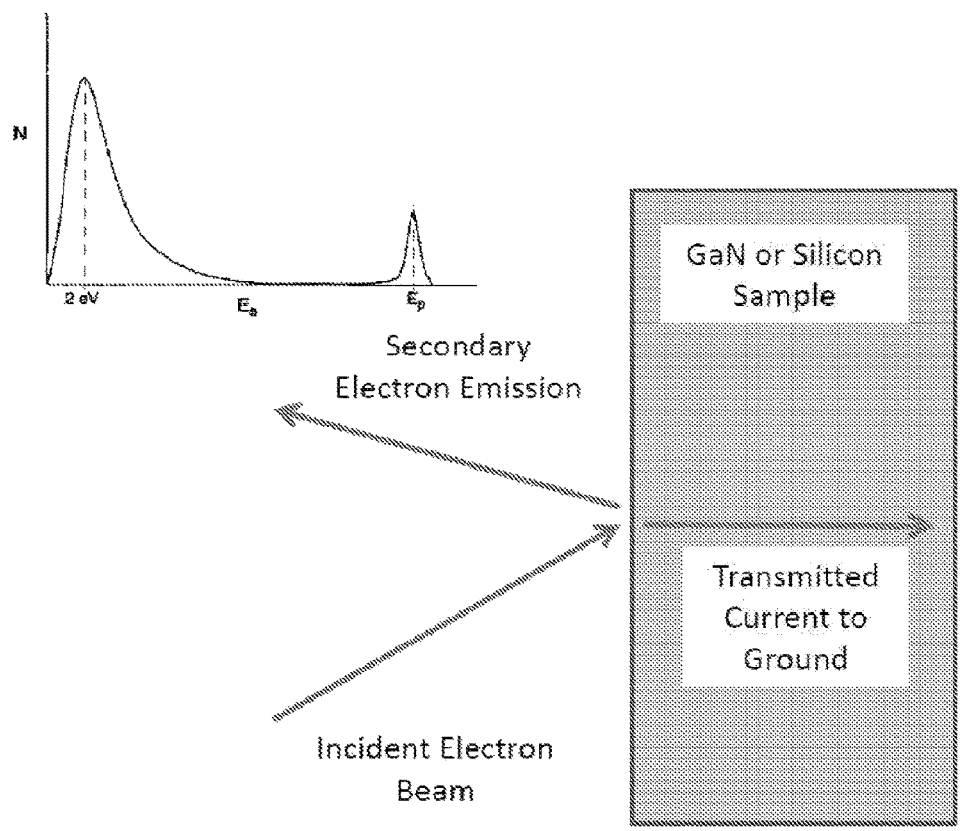
FIG. 12 is a scheme illustrating secondary electron emission derived from an incident electron beam.

In yet another aspect, electron energies greater than about 50 eV have significant secondary electron emission yields. This phenomenon is illustrated in FIG. 12, where an incident electron beam focused on a GaN or silicon sample yields a secondary electron emission. In certain embodiments, the secondary electron emission interacts with the sample undergoing ESD and causes additional desorption and/or etching.

In yet another aspect, the methods of the invention are useful for growing films at low temperatures, as demonstrated in the non-limiting examples recited herein.

Figure 16A:
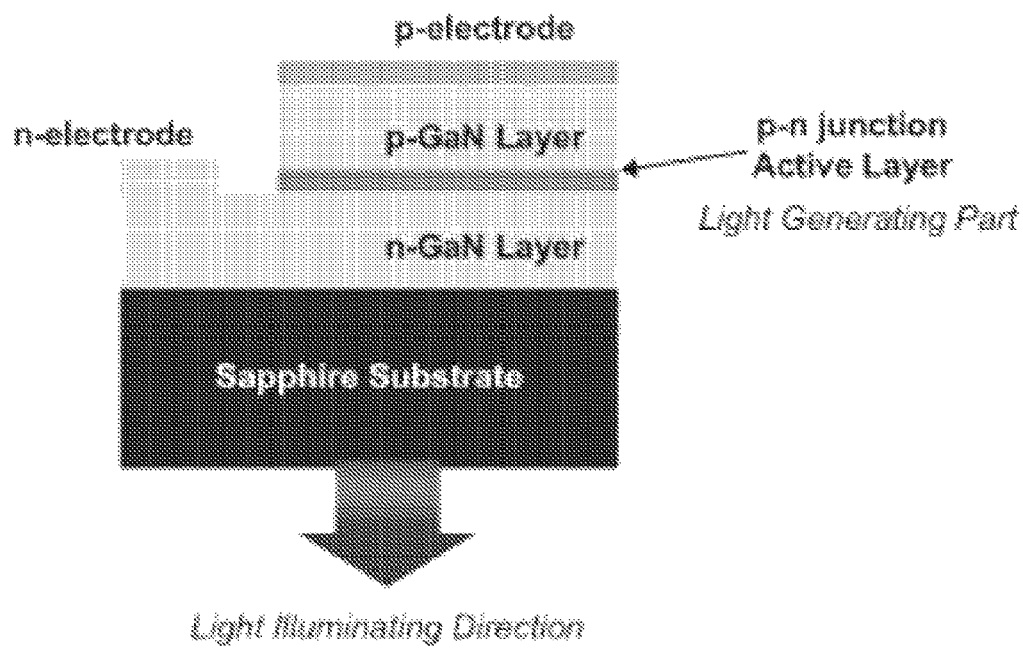

In certain embodiments, the methods of the present invention are used to deposit GaN on silicon-based complementary metal-oxide semiconductors (Si-CMOS; FIG. 16A), allowing for the preparation of addressable array LEDs at temperatures lower than 400° C. Currently, GaN deposition on Si-CMOS is not possible because of the required high deposition temperatures. The low-temperature GaN growth method of the present invention allows for the efficient and non-destructive deposition of GaN films on Si-CMOS.

Figure 16B:
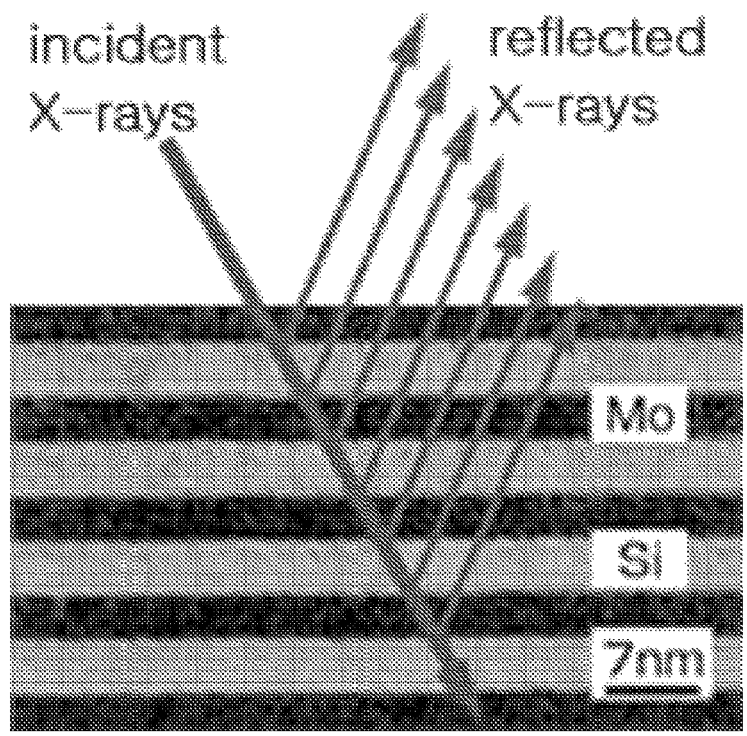

In certain embodiments, the methods of the present invention are used to deposit silicon layers on molybdenum/silicon multilayers (FIG. 16B), allowing for the preparation of EUV mirrors at temperatures lower than 200° C. Mo/Si multilayer devices are currently the best available EUV mirrors. A typical EUV mirror comprises 40 bilayers of Mo/Si with 3 nm of Mo and 4 nm of Si in each bilayer. Si must be deposited on the substrate at temperatures lower than 200° C., otherwise $MoSi_2$ may be formed. Thus, currently Mo—Si multilayers are prepared using sputtering, which leads to significant defects in the final device.

In certain embodiments, the methods of the present invention are used to deposit $Si_3N_4$ and $SiO_2$ layers, allowing for the preparation of semiconductor devices. $Si_3N_4$ and $SiO_2$, important industrial materials, can be prepared using thermal atomic layer deposition. The temperatures required are above 350° C., with very large exposures (greater than $10^9$ Langmuir or $10^3$ torr.sec) involved. In certain embodiments, the methods of the present invention are used to enhance ALD using $SiCl_4$ and $NH_3$ as the reactants for $Si_3N_4$ ALD, or $SiCl_4$ and $H_2O$ as the reactants for $SiO_2$ ALD. A non-limiting experimental set-up for such method is illustrated in FIG. 16C.

Compositions

The invention includes a thin film prepared using a method comprising desorbing at least one surface species from the substrate using electron stimulated desorption (ESD). In certain embodiments, the surface species is at least one selected from the group consisting of hydrogen, $CH_3$ (methyl), $CH_2CH_3$ (ethyl), $N(CH_3)_2$ (dimethylamino), Cl, Br, F, CO, cyclopentadienyl (Cp) and substituted cyclopentadienyl, and acetylacetonate (acac) and other beta-diketonates.

The invention further includes a thin film prepared using a method comprising the steps of: (a) submitting the solid substrate to ESD to desorb a surface species, thus generating at least one active site on the substrate; (b) reacting a molecule, wherein the molecule comprises a central element and a ligand, with the substrate generated in step (a), whereby the molecule is physically or chemically adsorbed onto the substrate; (c) in the case that the ligand is not a hydride, optionally submitting the substrate generated in step (b) to hydrogen radical flux, whereby the substrate-bound ligand is replaced with substrate-bound hydride ligand; and, (d) optionally repeating steps (a)-(c) until the desired film thickness is obtained.

The invention further includes a thin film prepared using a method comprising the steps of: (a) submitting the solid substrate to ESD, thus generating at least one active site on the substrate; (b) reacting a first molecule, wherein the first molecule comprises a first central element and a first ligand, with the substrate generated in step (a), whereby the first molecule is physically or chemically adsorbed onto the substrate; (c) in the case that the first ligand is not hydride, optionally submitting the substrate generated in step (b) to hydrogen radical flux, whereby the substrate-bound first ligand is replaced with substrate-bound hydride ligand; (d) submitting the solid substrate generated in step (b) or (c) to ESD, thus generating at least one active site on the substrate; (e) reacting a second molecule, wherein the second molecule comprises a second central element and a second ligand, with the substrate generated in step (d), whereby the second molecule is physically or chemically adsorbed onto the substrate; (f) in the case that the second ligand is not a hydride, optionally submitting the substrate from step (e) to hydrogen radical flux, whereby the substrate-bound second ligand is replaced with substrate-bound hydride ligand; and, (g) optionally repeating steps (a)-(f) until the desired film thickness is obtained.

The invention further includes a thin film prepared using a method comprising the steps of: (a) submitting a diamond substrate to ESD, thus generating at least one active site on the diamond substrate; (b) submitting the substrate generated in step (a) to methyl radical flux; (c) reacting the substrate generated in step (b) with hydrogen ions; (d) reacting the substrate generated in step (c) with a hydrogen radical flux; and, (e) optionally repeating steps (a)-(d) until the desired film thickness is obtained.

Methods

The invention includes a method of promoting thin film growth on a solid substrate. The method comprises desorbing at least one surface species from the substrate using electron stimulated desorption (ESD). In certain embodiments, the surface species is at least one selected from the group consisting of hydrogen, $CH_3$ (methyl), $CH_2CH_3$ (ethyl), $N(CH_3)_2$ (dimethylamino), Cl, Br, F, CO, cyclopentadienyl (Cp) and substituted cyclopentadienyl, and acetylacetonate (acac) and other beta-diketonates.

In certain embodiments, the temperature required for desorbing the surface species using ESD is lower than the temperature required for thermally desorbing the surface species. In other embodiments, the method allows for the controlled growth of the thin film. In yet other embodiments, the ESD is performed at a temperature equal to or lower than about 100° C., about 80° C., about 60° C., about 50° C., about 40° C., about 30° C. or about 20° C. In other embodiments, the ESD is performed at about room temperature.

In certain embodiments, the electron energy is equal to or lower than about 100 eV, about 75 eV, about 50 eV, about 25 eV, about 20 eV or about 10 eV. In yet other embodiments, the electron energy ranges from about 10 eV to about 20 eV, or from about 10 eV to about 25 eV.

In certain embodiments, the method comprises the steps of: (a) submitting the solid substrate to ESD to desorb a surface species, thus generating at least one active site on the substrate; (b) reacting a molecule comprising a central element and a ligand with the substrate generated in step (a), whereby the molecule is physically or chemically adsorbed onto the substrate; (c) in the case that the ligand is not a hydride, optionally submitting the substrate generated in step (b) to hydrogen radical flux, whereby the substrate-bound ligand is replaced with substrate-bound hydride ligand; and, (d) optionally repeating steps (a)-(c) until the desired film thickness is obtained.

In certain embodiments, the molecule comprises at least one ligand selected from the group consisting of hydrogen, methyl, ethyl, dimethylamino, Cl, Br, F, CO, cyclopentadienyl and substituted cyclopentadienyl, and acetylacetonate and other beta-diketonates. In other embodiments, the molecule comprises at least one hydride ligand. In yet other embodiments, the hydride comprises $SiH_4$. In yet other embodiments, ESD is applied during the reaction in step (b). In yet other embodiments, the method allows for continuous thin film growth.

In certain embodiments, the method comprises the steps of: (a) submitting the solid substrate to ESD, thus generating at least one active site on the substrate; (b) reacting a first molecule, wherein the first molecule comprises a first central element and a first ligand, with the substrate generated in step (a), whereby the first molecule is physically or chemically adsorbed onto the substrate; (c) in the case that the first ligand is not hydride, optionally submitting the substrate generated in step (b) to hydrogen radical flux, whereby the substrate-bound first ligand is replaced with substrate-bound hydride ligand; (d) submitting the solid substrate generated in step (b) or (c) to ESD, thus generating at least one active site on the substrate; (e) reacting a second molecule, wherein the second molecule comprises a second central element and a second ligand, with the substrate generated in step (d), whereby the second molecule is physically or chemically adsorbed onto the substrate; (f) in the case that the second ligand is not a hydride, optionally submitting the substrate from step (e) to hydrogen radical flux, whereby the substrate-bound second ligand is replaced with substrate-bound hydride ligand; and, (g) optionally repeating steps (a)-(f) until the desired film thickness is obtained.

In certain embodiments, the first and second molecules comprise a hydride ligand. In other embodiments, the first molecule comprises $GaH_3$ and the second molecule comprises $NH_3$. In yet other embodiments, the first molecule comprises a methyl or chloride ligand. In yet other embodiments, the first molecule comprises $Ga(CH_3)_3$ or $GaCl_3$. In yet other embodiments, the first molecule comprises a hydride ligand and the second molecule comprises a chloride ligand. In yet other embodiments, the first molecule comprises $NH_3$ and the second molecule comprises $SiCl_4$. In yet other embodiments, the first molecule comprises a methyl ligand and the second molecule comprises a hydrogen ligand. In yet other embodiments, the first molecule comprises $Ga(CH_3)_3$ and the second molecule comprises $NH_3$. In yet other embodiments, ESD is applied to the substrate during at least one step selected from step (b) and step (e). In yet other embodiments, the method allows for continuous thin film growth.

In certain embodiments, the method comprises the steps of: (a) submitting a diamond substrate to ESD, thus generating at least one active site on the diamond substrate; (b) submitting the substrate generated in step (a) to methyl radical flux; (c) reacting the substrate generated in step (b) with hydrogen ions; (d) reacting the substrate generated in step (c) with a hydrogen radical flux; and, (e) optionally repeating steps (a)-(d) until the desired film thickness is obtained.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. Although the description herein contains many embodiments, these should not be construed as limiting the scope of the invention but as merely providing illustrations of some of the presently preferred embodiments of the invention.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Example 1

Figure 5:
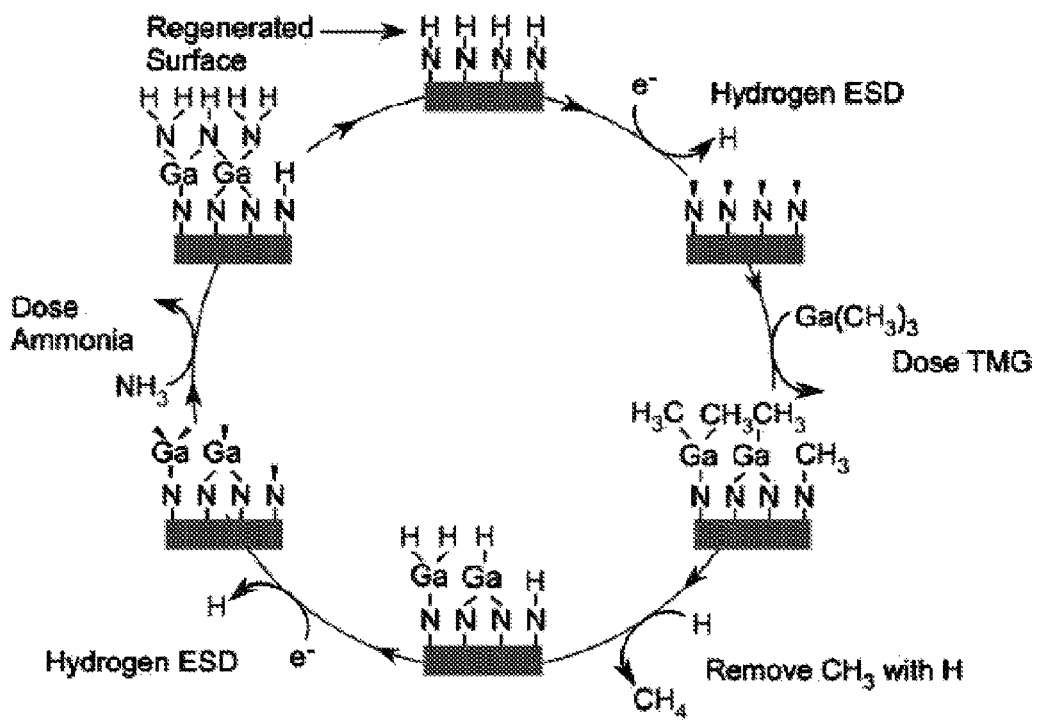
FIG. 5 is a schematic illustration of a non-limiting example of growth of GaN at low temperatures using $Ga(CH_3)_3$, H radicals, H ESD, $NH_3$ and H ESD.

The growth of GaN films on silicon wafers (FIG. 5) was studied using the following non-limiting conditions: Temperature=100° C.; Si substrates=Si(100) & Si(111); Electron energy: 100 eV & 50 eV; Electron current: —6-12 µA/cm$^2$; Electron exposure times: 30-60 s; Trimethyl gallium exposure: 0.03 to >1 Langmuir; Ammonium exposure: 0.002 to >1 Langmuir; Hydrogen radical exposure: $3 \times 10^{16}$-$8 \times 10^{17}$/cm$^2$.

The GaN film growth on silicon wafers was studied in situ using quadrupole mass spectrometry (QMS) and ex situ X-ray photoelectron spectroscopy (XPS), X-ray reflectivity (XRR) and spectroscopic ellipsometry (SE).

The set-up of the experiments is described below.

Experiment I 75 cycles were used at an electron energy of 100 eV. XPS analysis indicated presence of Ga, N and C, and the film thickness was estimated to about 31 Å.

Experiment II 75 cycles were used at an electron energy of 100 eV, with six times higher H radical exposure than in Experiment I. The film thickness was estimated to be about 20 Å. A lower amount of C was observed in XPS analysis as compared to Experiment I. Mass spectrometry analysis showed evidence for $Ga^+$ signal at m/z=69. Without wishing to be limited by any theory, H radical exposure plays a role in removing —$CH_3$ during GaN growth. In certain embodiments, lower electron energy may minimize Ga etching.

Experiment III 75 cycles were used at an electron energy of 50 eV. Mass spectrometry analysis showed reduction in $Ga^+$ signal at m/z=69, as compared to Experiment II. XPS analysis indicated presence of Ga, N and O. The film thickness was estimated to be about 41 Å. As demonstrated herein, electron energy plays a role in GaN etching and GaN growth.

Experiment IV 75 cycles were used at an electron energy of 50 eV, with longer TMG and $NH_3$ exposures as compared to the previous experiments. XPS analysis indicated presence of Ga, N and C. The film thickness was estimated to be about 36 Å. As demonstrated herein, the TMG and $NH_3$ exposures used in the previous experiments promote effective growth of the GaN film.

Figure 6:
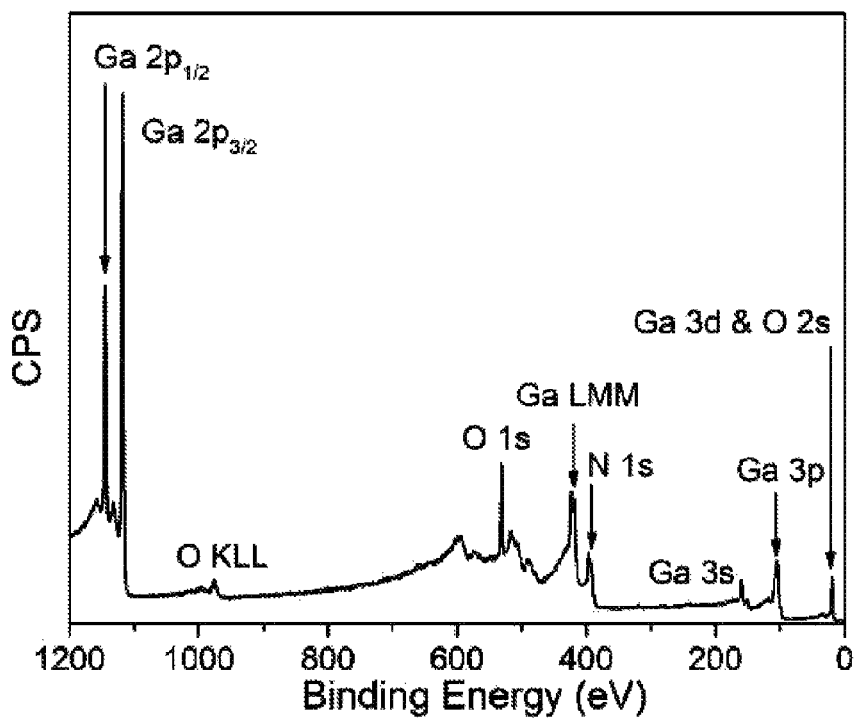
FIG. 6 is a graph illustrating XPS results for GaN film deposition on a silicon wafer at 100° C. from Example 1, Experiment V, after sputter clean. The XPS spectrum was consistent with a GaN film that is partially oxidized. No carbon was observed, and the GaN film was apparently thick enough to attenuate silicon XPS signal.

Experiment V 300 cycles were used at an electron energy of 50 eV, with longer TMG and $NH_3$ exposures as compared to the previous experiments. XPS analysis indicated presence of Ga, N and O. The film thickness was estimated to be about 47 Å. The XPS depth profile was consistent with oxidation of GaN film (FIG. 6). GaN growth was shown to be dependent on number of cycles, and surface oxidation of GaN film under the reaction conditions was found to be significant (see evidence of O in FIG. 6).

Experiment VI 425 cycles were used at an electron energy of 50 eV. XPS analysis indicated presence of Ga, N and O. The film thickness was estimated to be about 70 Å. GIXRD analysis indicated weak peak at ~35°. GaN growth was shown to be dependent on number of cycles. Further, the results indicate the presence of basal planes of GaN parallel to Si(111) surface, suggesting that a crystalline GaN film was formed on the silicon wafer.

Figure 7A:
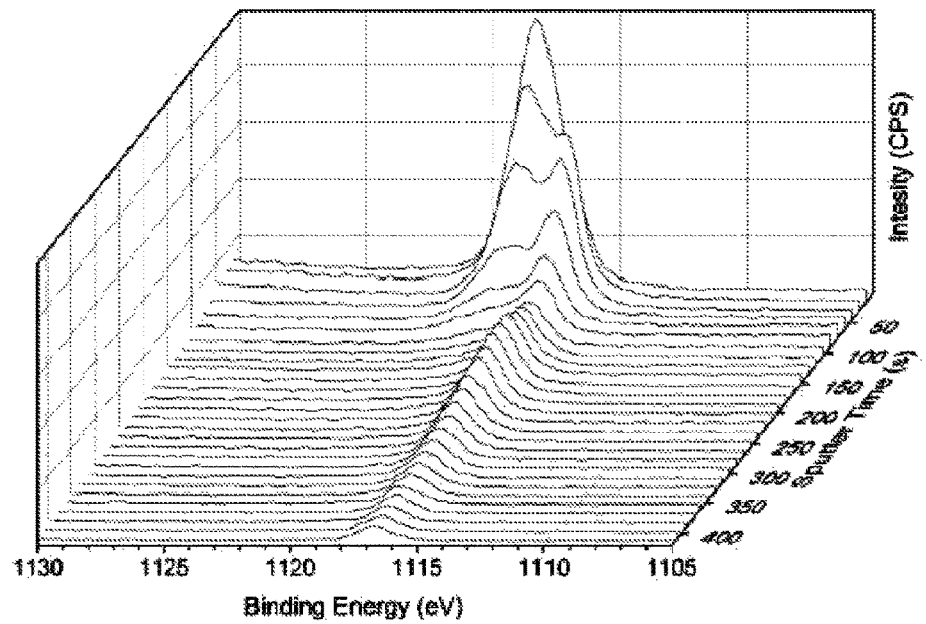
FIGS. 7A-7B, is a pair of graphs illustrating the monitoring of the Ga oxidation state in Example 1, Experiment VI, using the Ga $2p_{3/2}$ XPS signal.
Figure 7B:
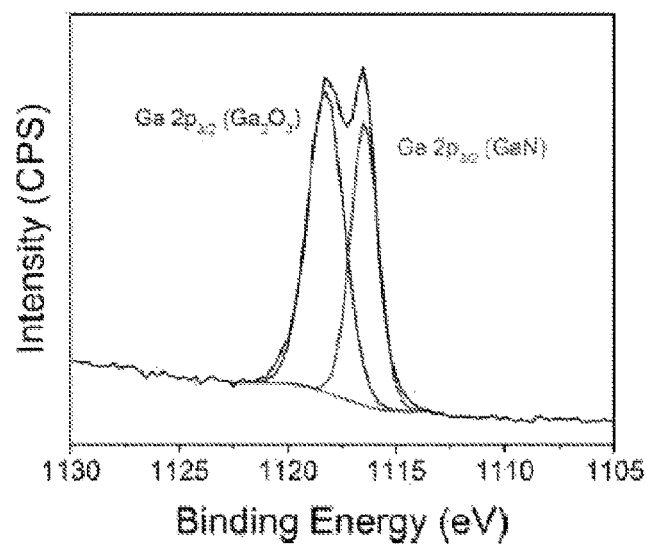

The Ga oxidation state was monitored in Experiment VI, using the Ga $2p_{3/2}$ XPS signal (FIG. 7). With increasing sputter times, the signal associated with Ga $2p_{3/2}$ ($Ga_2O_3$) was replaced with the signal associated with Ga $2p_{3/2}$ (GaN). These results suggest that the surface of the GaN film was oxidized in air under the reaction conditions, and increasing sputter times allowed for the observation of non-oxidized GaN film areas.

Figure 8:
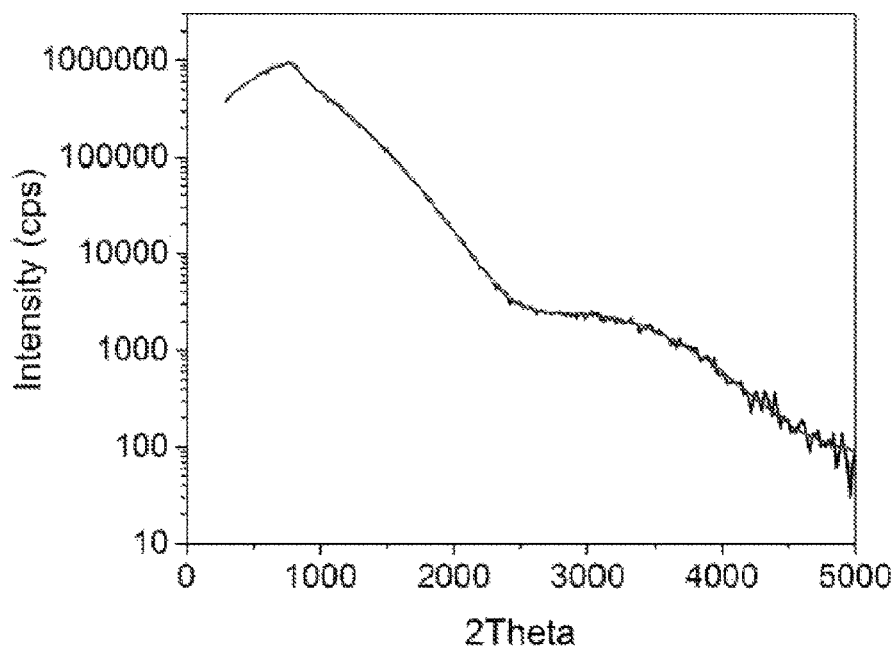
FIG. 8 is a graph illustrating XRR results for the GaN film on a silicon wafer from Example 1, Experiment VI. The model fit is illustrated as a continuous line on top of the experimental trace, and is consistent with a film thickness of about 70 Å, including a $Ga_2O_3$ top layer of about 18 Å thickness.

XRR results for the GaN film on a silicon wafer prepared in Experiment VI are illustrated in FIG. 8. The experimental results were well fit by a model wherein a layer of $Ga_2O_3$ was deposited on the surface of the GaN film on the silicon wafer. The $Ga_2O_3$ thickness was estimated to be about 18 Å, and the GaN thickness about 52 Å.

Figure 9:
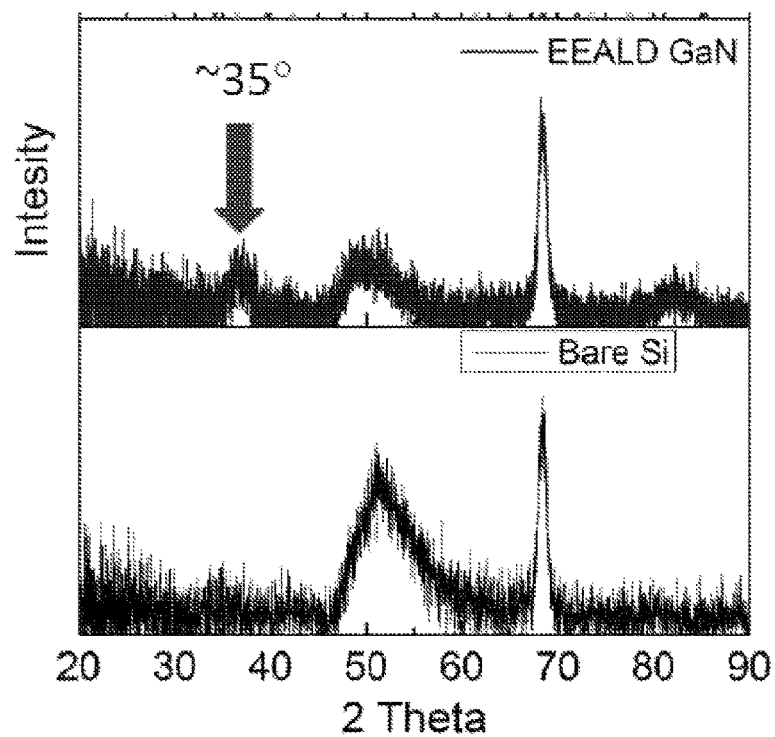
FIG. 9 is a pair of graphs illustrating XRD data for the GaN film on a silicon wafer formed in Example 1, Experiment VI.
Figure 10A:
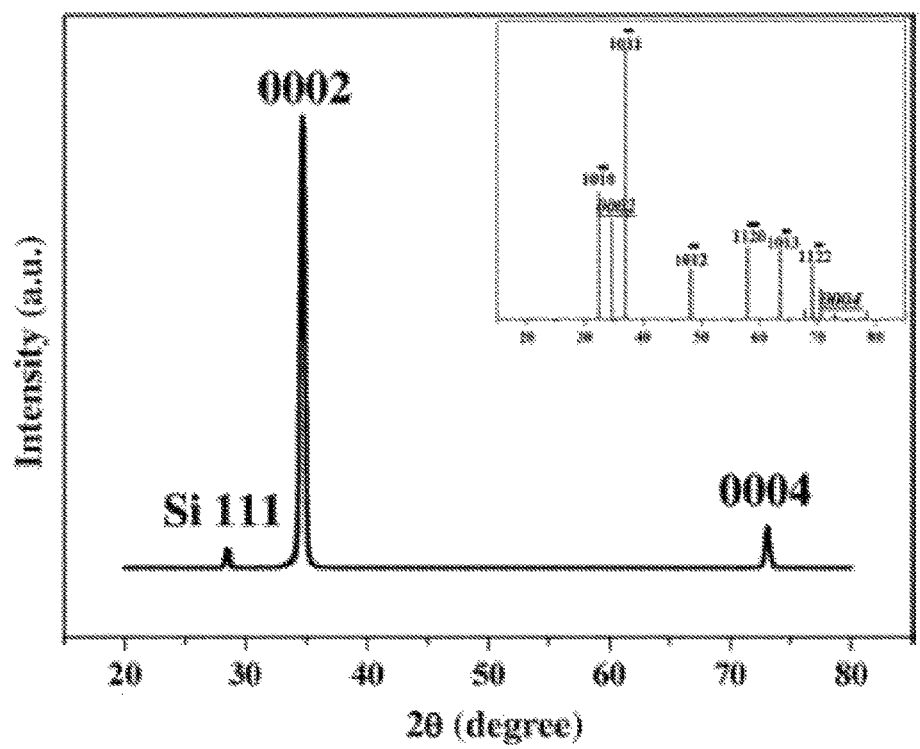
FIGS. 10A-10B, illustrates the XRD results for the GaN film on a Si(111) surface. No buffer layer was present. The observation of the (0002) peak in FIG. 10A was consistent with a "textured" GaN film with basal plane parallel to the Si(111) surface. The basal plane of hexagonal wurtzite GaN crystal structure is illustrated in FIG. 10B.
Figure 10B:
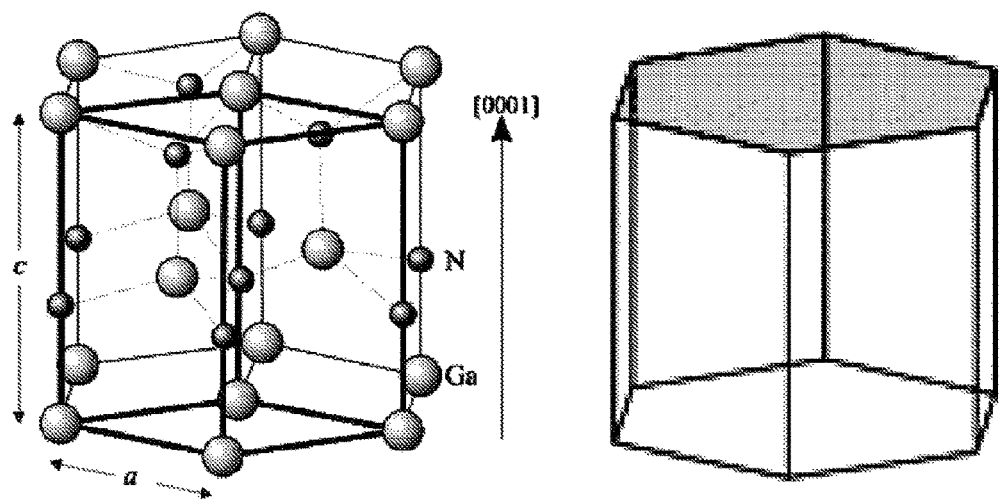

XRD results for the GaN film on a silicon wafer prepared in Experiment VI are illustrated in FIG. 9. A weak XRD peak was observed at about 35°, and that peak was not assigned to the silicon substrate. Additional XRD studies of GaN on Si(111) indicated that the strongest XRD peak was about 35°. The XRD peak of Experiment VI was thus assigned to (0002) GaN planes aligned parallel to the Si(111) surface. It should be noted that the (0002) plane is the basal plane of hexagonal-wurtzite crystal surface (FIG. 10).

Figure 17A:
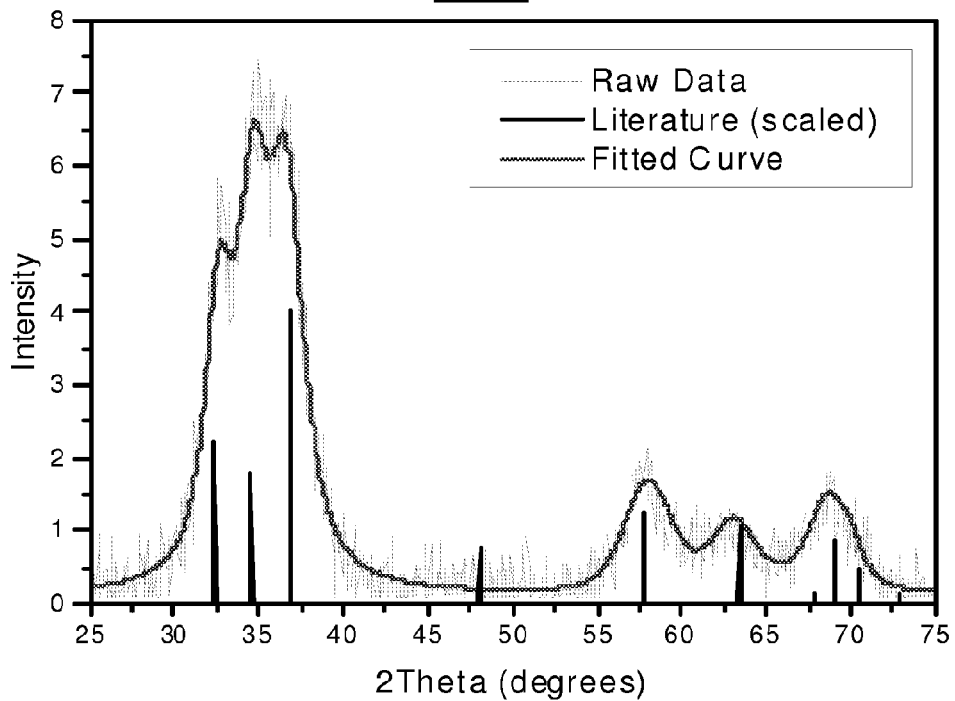
FIGS. 17A-17B, is a set of graphs illustrating the XRD analysis of the film prepared in Example 1, Experiment VII.
Figure 17B:
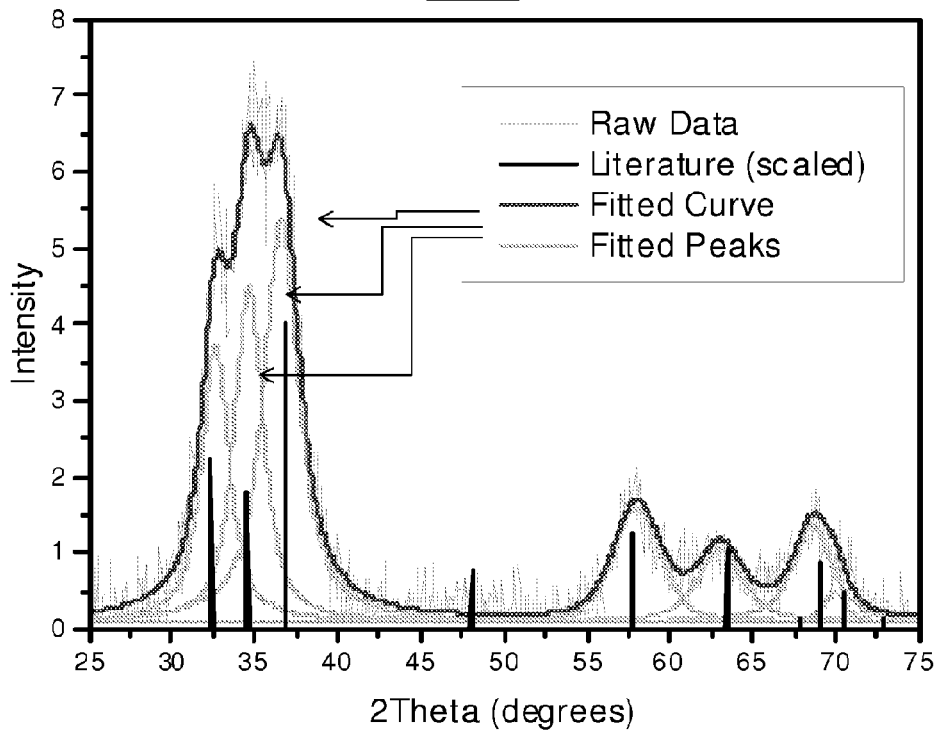

Experiment VII 827 cycles were used at an electron energy of 50 eV. The experiment was run using a hydrogen-passivated Si(111) wafer, and the initial cycles were run at 25 eV to avoid silicon etching. The film thickness was approximately 209 Å according to XRR analysis. This thickness compares well with the film thickness of 113 Å obtained with a shorter run of 451 cycles under the same conditions, suggesting the film thickness is approximately linear with the number of cycles. The ellipsometry measured a bandgap of the film of approximately 3.2-3.4 eV, as compared with the reported bandgap of 3.4 eV for GaN. Further, the real refractive index from the ellipsometry measurements was 2.14 for the film, as compared to the reported real refractive index of 2.4 for GaN. FIG. 17 illustrates XRD measurements for the present film along with crystalline GaN assignments and peak fits. The experimental spectrum is consistent with crystalline GaN. The peak at about 35° corresponds to GaN crystalline (0002) plane aligned parallel to the Si(111) surface. Taken together, these results are consistent with the formation of a crystalline GaN film on Si(111). In certain embodiments, the crystalline GaN film is epitaxial on Si(111).

Example 2

Figure 11A:
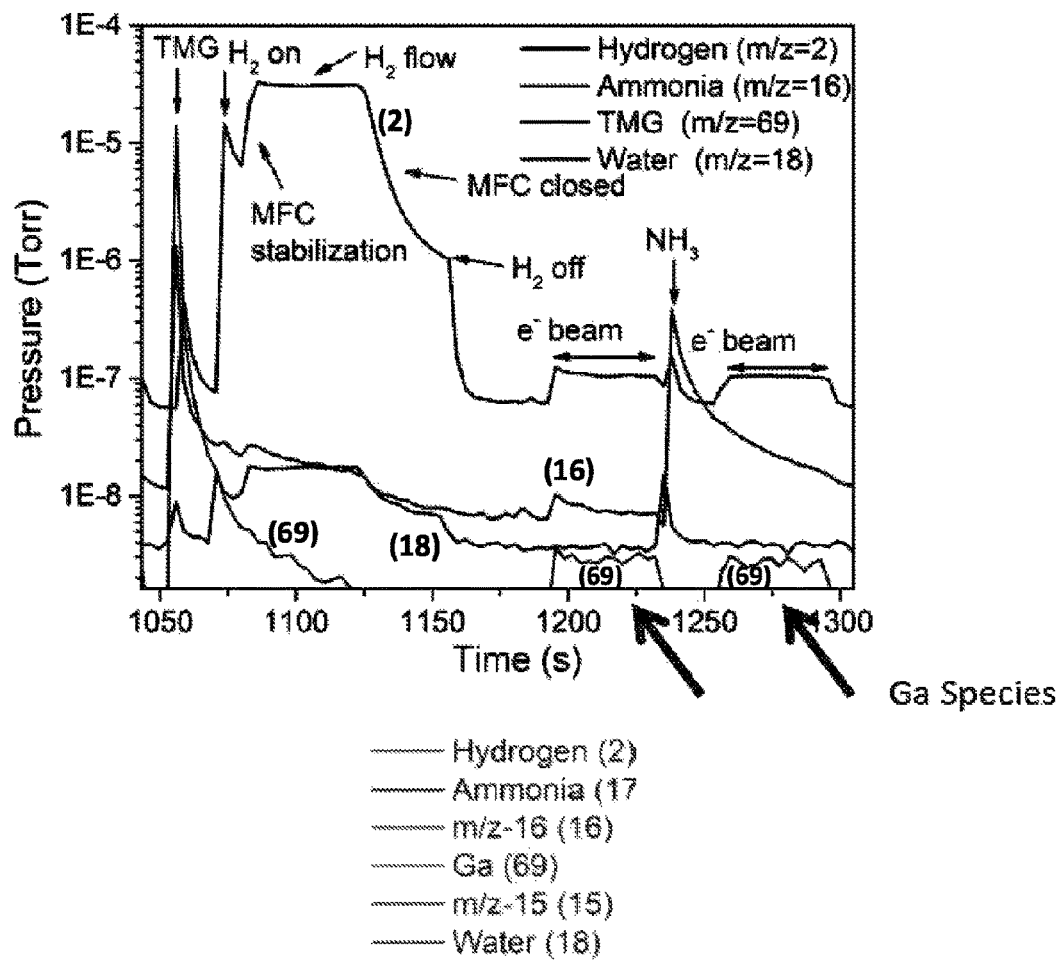
Figure 11C:
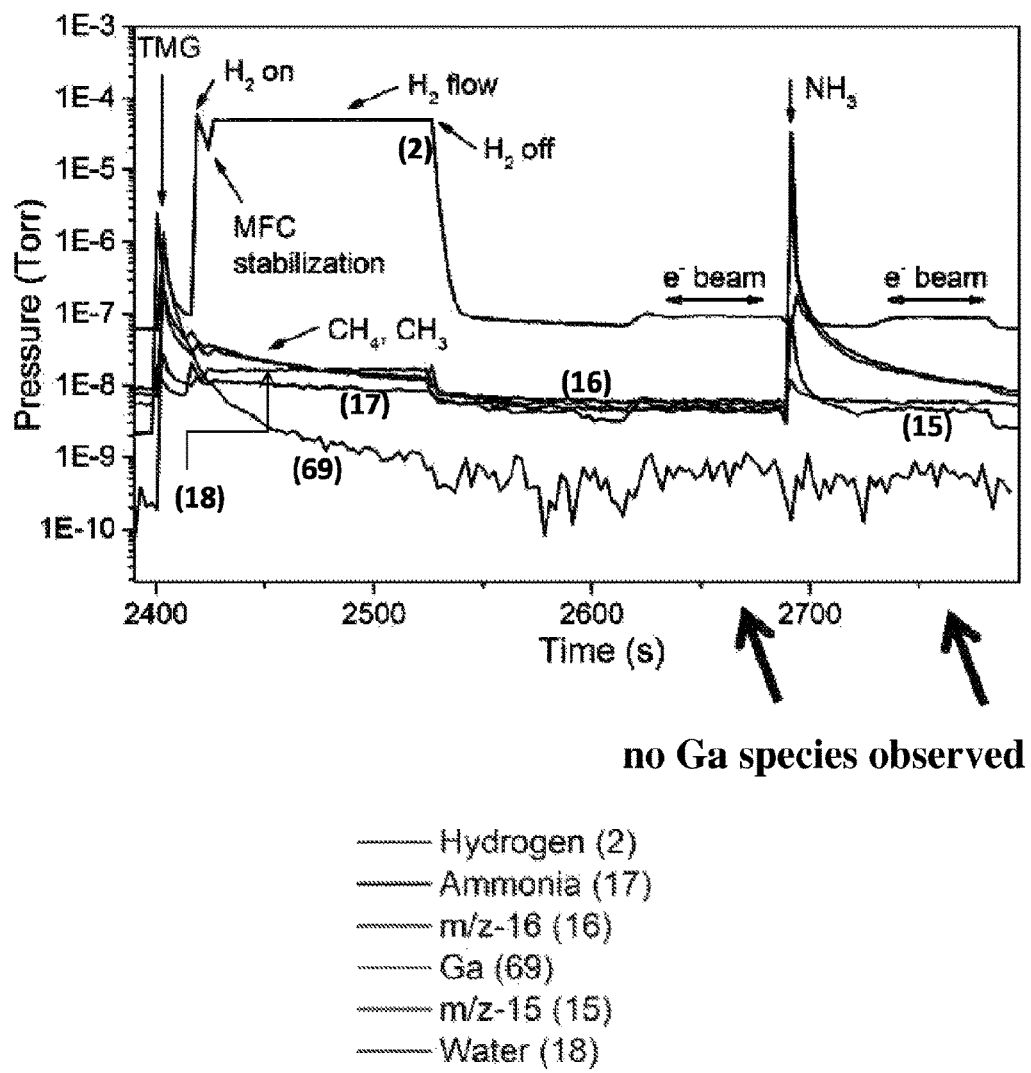

Evidence of etching of the solid material was observed in some of the Experiments recited in Example 1. FIG. 11 illustrates in situ QMS measurements taken during the GaN film growth in Example 1, Experiments I-III. In FIGS. 11A-11B, corresponding to electron energy of 100 eV, etching of Ga was evidenced by detection of a Ga species (see arrows). In FIG. 11C, corresponding to electron energy of 50 eV, etching of Ga was not detected, because no Ga species were observable (see arrows).

GaN etching products may be dependent on core electron binding energies. Table 1 illustrates core electron binding energies (in eV) for several materials. In certain embodiments, electron energies that are higher than core electron binding energies can cause film etching.

Without wishing to be limited by any theory, etching that takes place during the ESD process may reduce the rate of film growth on a solid substrate. In other embodiments, the ESD process removes hydrogen to form dangling bonds, as well as remove hydride species and etch the growing film. In the case of GaN films, the observation of a QMS signal at m/z=69 for $Ga^+$ was consistent with etching, and such signal was observed for electron energies of 100 eV. The m/z=69 signal was reduced when electron energies of 50 eV were used (FIG. 11).

In certain embodiments, hydrogen ESD processes can be performed at low electron energies and/or low temperatures, in order to minimize etchings and maximize hydrogen ESD. In other embodiments, electron energies lower than 100 eV, such as 10-20 eV, can desorb hydrogen without desorbing GaN hydrides. Such energy ranges allow for GaN growth using GaN etching. In yet other embodiments, lower temperatures allow for greater hydrogen ESD and lower GaN etching. In yet other embodiments, use of lower temperatures minimize etching pathways.

TABLE 1

Core electron binding energies (in eV)

| Gallium | Nitrogen | Silicon |
|---|---|---|
| 18.7 (3d) | 37.3 (2s) | 99.2 ($2p_{3/2}$) |
| 100 ($3p_{3/2}$) | 409.9 (1s) | 99.8 ($3p1/_2$) |
| 103.5 ($3p_{1/2}$) | | 149.7 (2s) |
| 159.5 (3s) | | |

Example 3

A capping layer can be used to protect the GaN film from air oxidation. In a non-limiting procedure, trimethylaluminum (TMA) is adsorbed onto the GaN surface. —$CH_3$ groups are removed using H radicals, and H species are removed using ESD or $H_2$ thermal desorption. TMA is then again adsorbed onto the aluminum surface. —$CH_3$ groups are removed using H radicals, and H species are removed using ESD or $H_2$ thermal desorption. This procedure is repeated to grow an aluminum film onto the GaN film. The aluminum film oxidizes in the presence of air, thus forming a protective $Al_2O_3$ layer on the aluminum film and protecting the GaN film from air oxidation.

Example 4

Potential GaN etching during electron beam exposure during GaN growth was evaluated (FIG. 13). The hydrogen radical exposures were performed using a hydrogen atomic beam source (HABS). FIG. 13A illustrates the pressure jump at m/z=2 ($H_2^+$) during electron beam exposure. The $H_2^+$ species may be derived from recombination of H ESD with another H atom. The experimental threshold appears to be around 50 eV, and similar $H_2^+$ signals were observed after HABS and ammonia exposures. FIG. 13B illustrates the pressure jump at m/z=69 ($Ga^+$) during electron beam exposure. The $Ga^+$ species at m/z=69 displayed steady increase as a function of electron energy, with the threshold appearing to be around 50 eV. Similar signals were observed after HABS and ammonia exposures. FIG. 13C illustrates the pressure jump at m/z=71 ($GaH_2^+$) during electron beam exposure. That species correlated well with the $Ga^+$ species at m/z=69. Similar results for the $GaH^+$ species at m/z=70 suggest that $GaH_3$ is the etch product evidenced in this experiment.

Figure 14A:
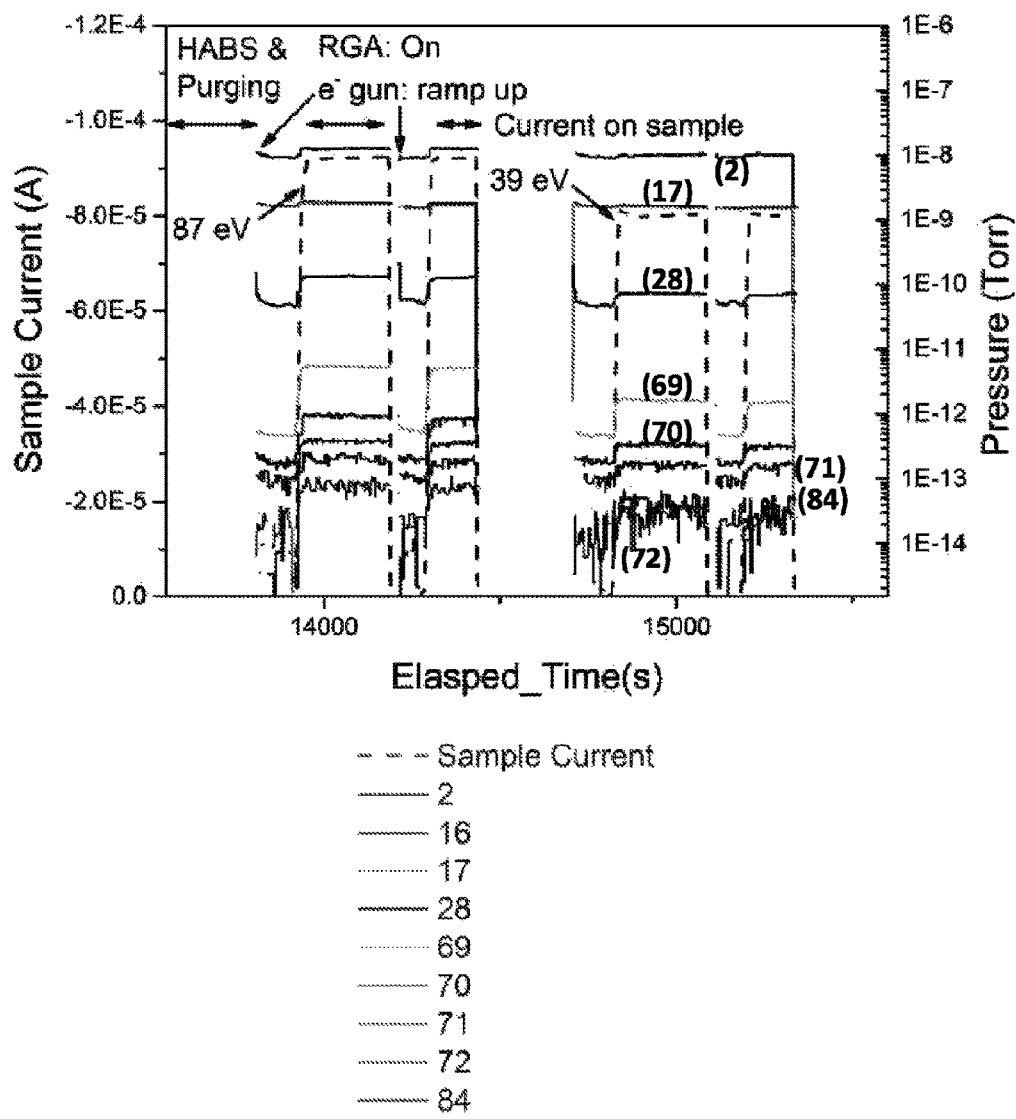

The nature of the etching process was further investigated by monitoring mass spectrometry pressures during hydrogen and electron beam exposures on a GaN film (FIG. 14). No $Ga(CH_3)_3$ or $NH_3$ reactant exposures were used during these measurements. FIG. 14B (corresponding to pressure jump at m/z=2 for $H_2^+$) and FIG. 14C (corresponding to m/z=69 for $Ga^+$) indicated a threshold value at about 25 eV. Similar results for the $GaH^+$ species at m/z=70 suggested that $GaH_3$ is the etch product evidenced in this experiment.

Electron stimulated desorption of hydrogen is required to form dangling bonds, and the present experiments suggest that this phenomenon is observed for electron energies of 25-50 eV. At the same time, the present experiments suggest that GaN etching takes place, as evidenced by the detection of Ga and $GaH_x$ desorption products, with a threshold energy of 25-50 eV. Further, these experiments suggest that the degree of etching increases with electron energy. In certain embodiments, GaN growth performed with electron energies of 25-50 eV allow for effective hydrogen desorption with minimal degree of etching.

Example 5

Figure 15B:
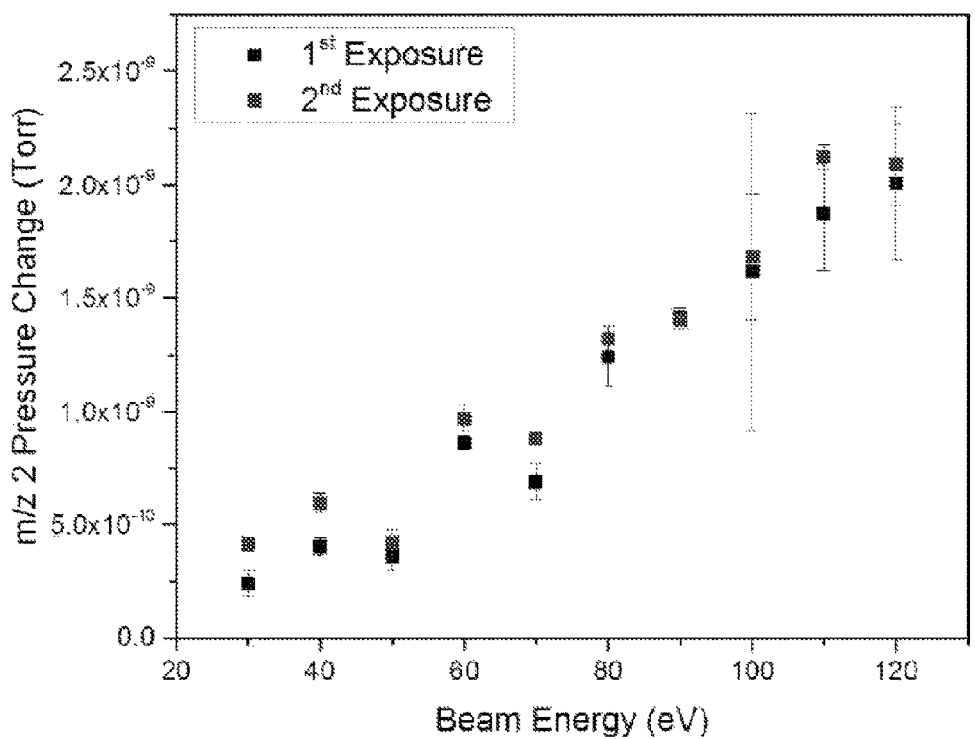
Figure 15C:
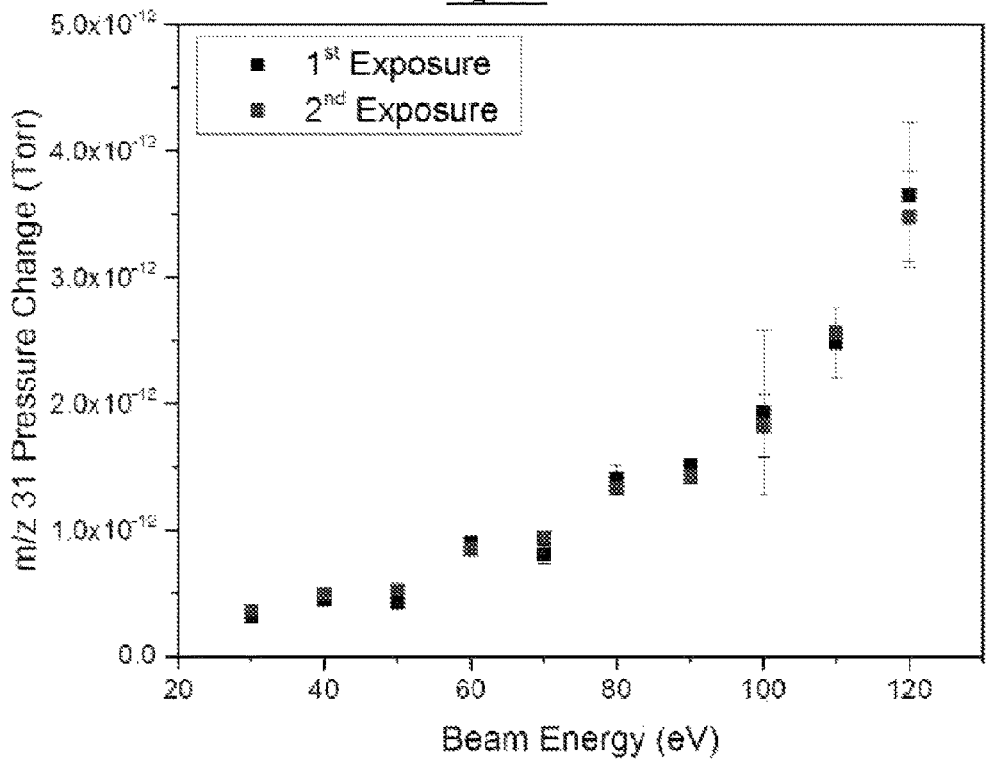

Potential etching of a clean Si(111) wafer was also investigated (FIG. 15). This etching may occur during the nucleation of the GaN film growth on Si(111). Mass spectrometry pressure jumps were investigated during either alternation between hydrogen and electron beam exposures (H/ESD), or repetitive electron beam exposures only (ESD only). Grid voltage was adjusted for each electron energy to ensure more constant electron current. FIGS. 15B-15C indicate a threshold at less than about 30 eV, wherein the second electron exposure occurs without additional hydrogen exposure. The experiments are consistent with $SiH_4$ as the etching product, since main $SiH_4$ cracking signals were observed at m/z=30 and m/z=31. Without wishing to be limited by any theory, the experiments did not provide evidence of a threshold corresponding to core binding energies of the surface materials.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of promoting thin film growth on a solid substrate, wherein the method comprises:
    (a) submitting the solid substrate to electron stimulated desorption (ESD) using an electron beam to desorb a surface species, wherein the electron beam has an electron energy value that does not cause significant etching of the solid substrate, thus generating at least one active site on the solid substrate; and
    (b) reacting a first molecule, wherein the first molecule comprises a first central element and a first ligand, wherein the first ligand is not a hydride, with the solid substrate generated in step (a), whereby the first molecule is physically or chemically adsorbed onto the solid substrate;
    (c) submitting the solid substrate comprising the adsorbed first molecule generated in step (b) to hydrogen radical flux, whereby the solid substrate-bound first ligand is replaced with solid substrate-bound hydride ligand; and,
    (d) repeating steps (a)-(c) at least once.

2. The method of claim 1, wherein the temperature required for desorbing the surface species from the solid substrate using ESD is lower than the temperature required for thermally desorbing the surface species from the solid substrate.

3. The method of claim 1, wherein the temperature required for desorbing the surface species using ESD is selected from the group consisting of: equal to or lower than about 100° C., and about room temperature.

4. The method of claim 1, wherein the surface species is at least one selected from the group consisting of hydrogen, $CH_3$ (methyl), $CH_2CH_3$ (ethyl), $N(CH_3)_2$ (dimethylamino), Cl, Br, F, CO, cyclopentadienyl (Cp) and substituted cyclopentadienyl, and acetylacetonate (acac) and other beta-diketonates.

5. The method of claim 1, wherein the electron energy used during ESD is selected from the group consisting of: equal to or lower than about 100 eV, and ranging from about 25 eV to about 50 eV.

6. The method of claim 1, wherein the method allows for the controlled growth of the thin film.

7. The method of claim 1, wherein ESD is applied during the reaction in step (b).

8. The method of claim 7, wherein the method allows for continuous thin film growth.

9. The method of claim 1, wherein the solid substrate comprises a molybdenum/silicon multilayer substrate and the thin film comprises silicon.

10. The method of claim 1, wherein the thin film comprises at least one selected from the group consisting of $Si_3N_4$ and $SiO_2$.

11. The method of claim 1, wherein the thin film is at least partially crystalline.

12. A method of promoting thin film growth on a solid substrate, wherein the method comprises:
   (a) submitting the solid substrate to electron stimulated desorption (ESD) using an electron beam to desorb a surface species, wherein the electron beam has an electron energy value that does not cause significant etching of the solid substrate, thus generating at least one active site on the solid substrate; and
   (b) reacting a first molecule, wherein the first molecule comprises a first central element and a first ligand, with the solid substrate generated in step (a), whereby the first molecule is physically or chemically adsorbed onto the solid substrate;
   (c) in the case that the first ligand is not a hydride, submitting the solid substrate comprising the adsorbed first molecule generated in step (b) to hydrogen radical flux, whereby the solid substrate-bound first ligand is replaced with solid substrate-bound hydride ligand;
   (d) submitting the solid substrate generated in step (b) or (c) to ESD, wherein the electron beam has an electron energy value that does not cause significant etching of the solid substrate, thus generating at least one active site on the solid substrate comprising the adsorbed first molecule;
   (e) reacting a second molecule, wherein the second molecule comprises a second central element and a second ligand, with the solid substrate generated in step (d), whereby the second molecule is physically or chemically adsorbed onto the solid substrate;
   (f) in the case that the second ligand is not a hydride, submitting the solid substrate from step (e) to hydrogen radical flux, whereby the substrate-bound second ligand is replaced with substrate-bound hydride ligand; and,
   (g) repeating steps (a)-(f) at least once.

13. The method of claim 12, wherein the first and the second molecules are such that: (a) the first and second molecules comprise a hydride ligand; (b) the first molecule comprises a methyl or chloride ligand; (c) the first molecule comprises a hydride ligand and the second molecule comprises a chloride ligand; or (d) the first molecule comprises a methyl ligand and the second molecule comprises a hydrogen ligand.

14. The method of claim 13, wherein the first and the second molecules are such that: in (a) the first molecule comprises $GaH_3$ and the second molecule comprises $NH_3$; (b) the first molecule comprises $Ga(CH_3)_3$ or $GaCl_3$; (c) the first molecule comprises $NH_3$ or $H_2O$, and wherein the second molecule comprises $SiCl_4$; or (d) the first molecule comprises $Ga(CH_3)_3$ and the second molecule comprises $NH_3$.

15. The method of claim 12, wherein ESD is applied to the solid substrate during at least one step selected from step (b) and step (e).

16. The method of claim 15, wherein the method allows for continuous thin film growth.

* * * * *